United States Patent
Wu et al.

(10) Patent No.: US 12,328,931 B2
(45) Date of Patent: Jun. 10, 2025

(54) HYBRID INTEGRATED CIRCUIT DIES AND METHODS OF FORMING THE SAME

(71) Applicant: Taiwan Semiconductor Manufacturing Co., Ltd., Hsinchu (TW)

(72) Inventors: Hong-Shyang Wu, Taipei (TW); Kuo-Ming Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 114 days.

(21) Appl. No.: 17/748,363

(22) Filed: May 19, 2022

(65) Prior Publication Data

US 2023/0282525 A1 Sep. 7, 2023

Related U.S. Application Data

(60) Provisional application No. 63/268,869, filed on Mar. 4, 2022.

(51) Int. Cl.
*H01L 21/8258* (2006.01)
*H01L 21/768* (2006.01)
(Continued)

(52) U.S. Cl.
CPC ........... *H10D 84/08* (2025.01); *H01L 23/535* (2013.01); *H10D 86/01* (2025.01); *H10D 86/201* (2025.01);
(Continued)

(58) Field of Classification Search
CPC ............... H01L 23/535; H01L 27/1207; H01L 21/8258; H01L 21/84; H01L 27/0688; H01L 27/1203
(Continued)

(56) References Cited

U.S. PATENT DOCUMENTS 11,450,751 B2 9/2022 Su et al.
2001/0013657 A1* 8/2001 Anand .................... H01L 24/05
438/614

(Continued)

FOREIGN PATENT DOCUMENTS

| CN | 103582962 A | 2/2014 |
| TW | 202201696 A | 1/2022 |
| TW | 202207405 A | 2/2022 |

OTHER PUBLICATIONS

Shrestha, N.M. et al., "Simulation study on electrical characteristic of AlGaN/GaN high electron mobility transistors with AlN spacer layer," Japanese Journal of Applied Physics, vol. 53, Feb. 24, 2014, 7 pages.

*Primary Examiner* — Peter Bradford
(74) *Attorney, Agent, or Firm* — Slater Matsil, LLP

(57) ABSTRACT

In an embodiment, a device includes: a gallium nitride device on a substrate, the gallium nitride device including an electrode; a dielectric layer on and around the gallium nitride device; an isolation layer on the dielectric layer; a semiconductor layer on the isolation layer, the semiconductor layer including a silicon device; a through via extending through the semiconductor layer, the isolation layer, and the dielectric layer, the through via electrically and physically coupled to the electrode of the gallium nitride device; and an interconnect structure on the semiconductor layer, the interconnect structure including metallization patterns electrically coupled to the through via and the silicon device.

20 Claims, 29 Drawing Sheets

(51) Int. Cl.
  *H01L 23/535* (2006.01)
  *H01L 27/12* (2006.01)
  *H10D 84/08* (2025.01)
  *H10D 86/00* (2025.01)
  *H10D 86/01* (2025.01)
  *H10D 87/00* (2025.01)
  *H01L 21/762* (2006.01)

(52) U.S. Cl.
  CPC ....... *H10D 87/00* (2025.01); *H01L 21/76251* (2013.01); *H01L 21/76805* (2013.01); *H01L 21/76898* (2013.01)

(58) Field of Classification Search
  USPC .............................................. 257/78; 438/22
  See application file for complete search history.

(56) References Cited

U.S. PATENT DOCUMENTS

| | | | |
|---|---|---|---|
| 2008/0283873 A1* | 11/2008 | Yang | H10B 69/00 |
| | | | 257/E27.081 |
| 2016/0327737 A1* | 11/2016 | Zhang | H01L 31/12 |
| 2017/0309676 A1* | 10/2017 | Odnoblyudov | H01L 27/1203 |
| 2018/0145052 A1* | 5/2018 | Dasgupta | H01L 29/7787 |
| 2018/0269105 A1* | 9/2018 | Susai | H01L 21/187 |
| 2018/0302046 A1* | 10/2018 | Mitzlaff | H03F 3/245 |
| 2019/0189603 A1* | 6/2019 | Wang | H01L 23/481 |
| 2021/0280579 A1 | 9/2021 | Lin et al. | |
| 2022/0037243 A1 | 2/2022 | Yeh et al. | |
| 2022/0293820 A1* | 9/2022 | Fitzgerald | C01G 53/82 |
| 2022/0399310 A1* | 12/2022 | Sharma | H01L 23/481 |
| 2023/0145652 A1* | 5/2023 | Neel | H01S 5/0239 |
| | | | 385/3 |

* cited by examiner

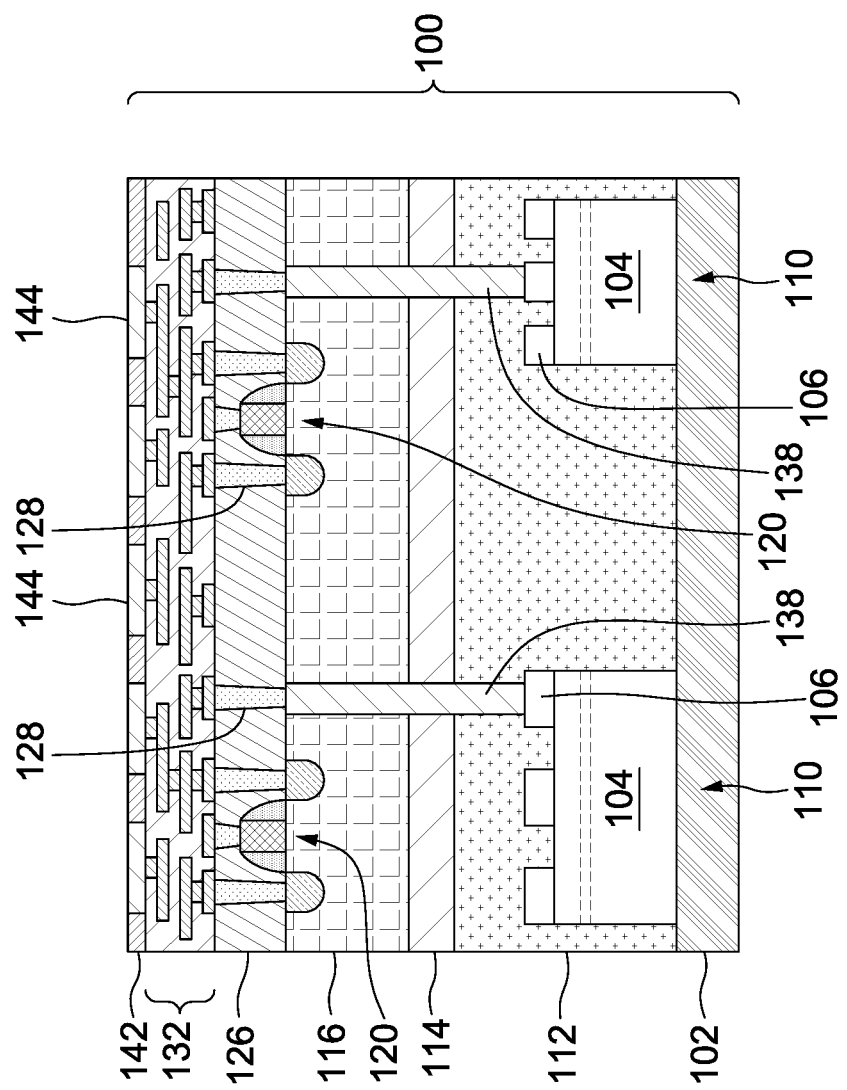

HYBRID INTEGRATED CIRCUIT DIES AND METHODS OF FORMING THE SAME

PRIORITY CLAIM AND CROSS-REFERENCE

This application claims the benefit of U.S. Provisional Application No. 63/268,869, filed on Mar. 4, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A-11C are cross-sectional views of hybrid integrated circuit dies, in accordance with various embodiments.

DETAILED DESCRIPTION

Figure 1:
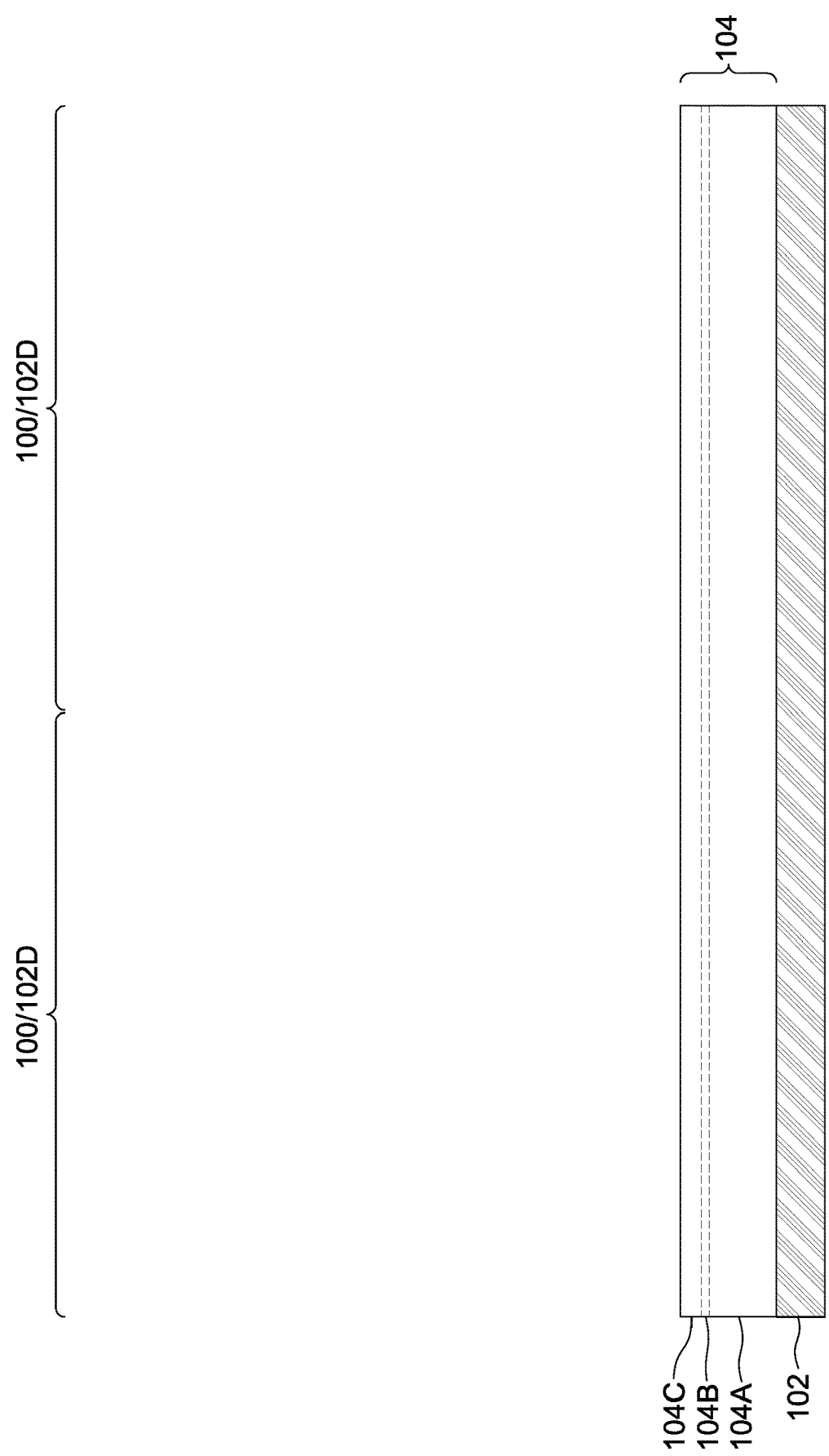
FIGS. 1-10 are cross-sectional views of intermediate stages in the manufacturing of hybrid integrated circuit dies, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, hybrid integrated circuit dies include different types of semiconductor devices, such as Group III-V semiconductor devices and Group IV semiconductor devices. The Group III-V semiconductor devices have a high gain and are capable of operating at a high frequency. The Group IV semiconductor devices have a small size and are capable of dense integration. The Group III-V semiconductor devices and Group IV semiconductor devices are interconnected by through-substrate vias (TSVs). Additionally, isolation features are between the semiconductor devices, which helps improve performance of the semiconductor devices. Forming both Group III-V semiconductor devices and Group IV semiconductor devices in a hybrid integrated circuit die allows for die-level interconnection of the semiconductor devices, without utilizing packaging-level features to interconnect the semiconductor devices.

FIGS. 1-10 are cross-sectional views of intermediate stages in the manufacturing of hybrid integrated circuit dies 100, in accordance with some embodiments. A plurality of device regions 102D are shown, and a hybrid integrated circuit die 100 is formed in each of the device regions 102D. The device regions 102D will be subsequently singulated to form the hybrid integrated circuit dies 100.

In FIG. 1, a substrate 102 is provided, and a stack of first semiconductor layers 104 is formed on the substrate 102. The substrate 102 may be silicon substrate, doped or undoped, or an active layer of a semiconductor-on-insulator (SOI) substrate. The substrate 102 may include other semiconductor materials, such as germanium; a compound semiconductor including silicon carbide, gallium arsenic, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 102 may include insulating materials, such as sapphire, aluminum nitride, the like, or combinations thereof. In some embodiments, the substrate 102 includes sapphire.

The first semiconductor layers 104 are each formed of a III-V compound semiconductor, such as gallium nitride, gallium arsenic, aluminum gallium nitride, aluminum gallium arsenide, aluminum nitride, or the like. At least two of the first semiconductor layers 104 form a heterojunction. Although three of the first semiconductor layers 104 are illustrated, any desired quantity of the first semiconductor layers 104 may be formed. Each of the first semiconductor layers 104 may be epitaxially grown using a process such as vapor phase epitaxy (VPE) or molecular beam epitaxy (MBE), deposited using a process such as chemical vapor deposition (CVD) or atomic layer deposition (ALD), or the like.

In some embodiments, the first semiconductor layers 104 are gallium nitride layers that include a buffer layer 104A formed of gallium nitride, a spacer layer 104B formed of aluminum nitride, and a barrier layer 104C formed of aluminum gallium nitride. The spacer layer 104B is optional, and is thinner than the buffer layer 104A and the barrier layer 104C. In some embodiments, the buffer layer 104A has a thickness in the range of 1 µm to 3.5 µm, the spacer layer 104B has a thickness in the range of 0.001 µm to 0.01 µm, and the barrier layer 104C has a thickness in the range of 0.01 µm to 0.05 µm. During operation, a two-dimensional electron gas (2DEG) is formed between the buffer layer 104A and the spacer layer 104B (if present) or the barrier layer 104C (if the spacer layer 104B is not present). The spacer layer 104B, when present, may increase the concentration level of the 2DEG. The first semiconductor layers 104 may also include additional layers (not separately illustrated), such as nucleation layers, transition layers, and the like. For example, a nucleation layer of aluminum nitride may be between the buffer layer 104A and the substrate 102.

Figure 2:
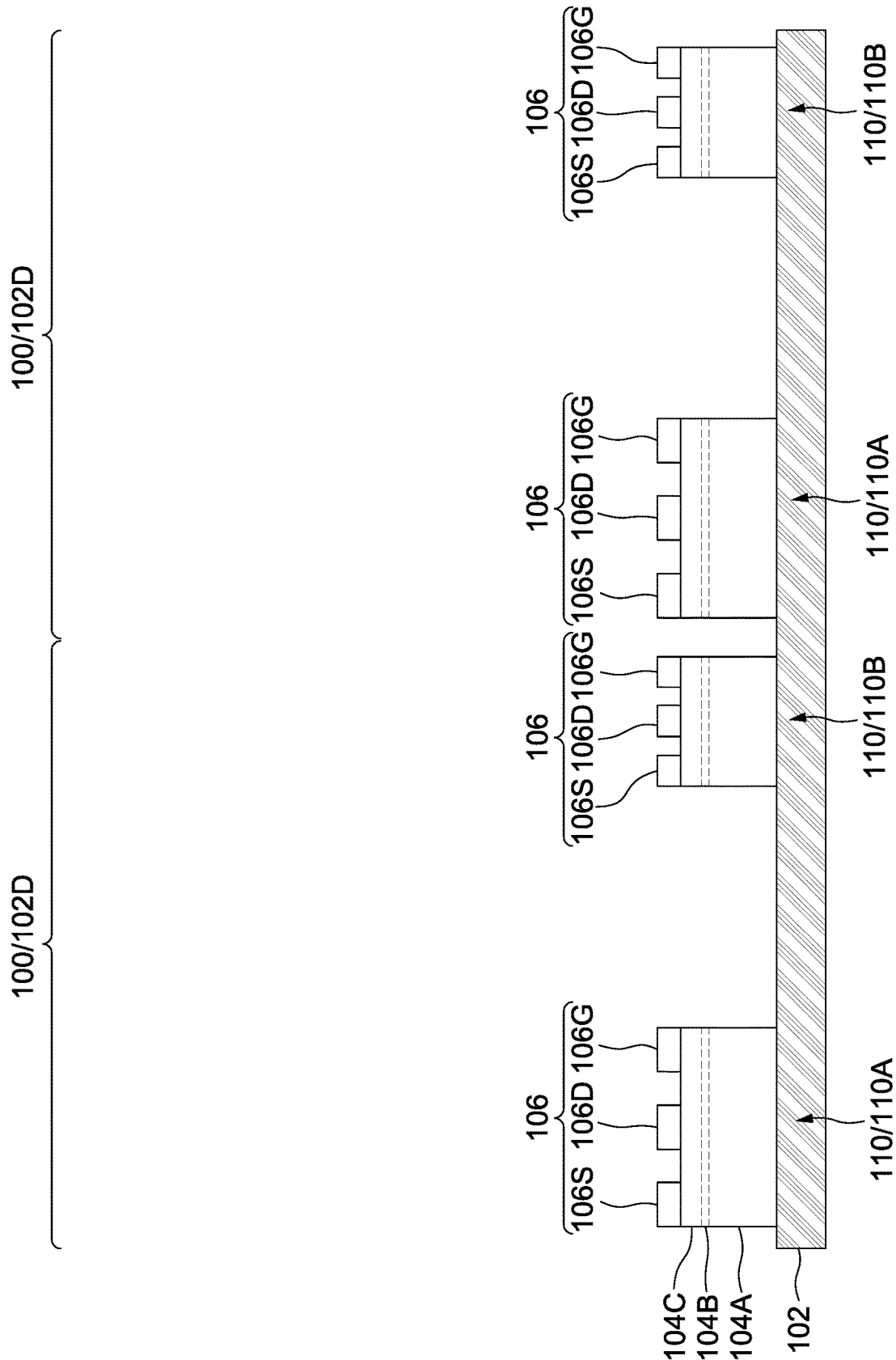

In FIG. 2, first semiconductor devices 110 are formed from the first semiconductor layers 104. The first semiconductor devices 110 are Group III-V semiconductor devices, such as gallium nitride (GaN) devices, silicon carbide (SiC) devices, or the like. The first semiconductor devices 110 may be high-voltage drivers, high-electron-mobility transistors (HEMTs), or the like. The first semiconductor devices 110 may be high-frequency semiconductor devices, such as devices that have an operating frequency in the range of 5 GHz to 100 GHz. In some embodiments, the first semiconductor devices 110 include different semiconductor devices 110A, 110B. For example, the semiconductor devices 110A may be high-voltage drivers and the semiconductor devices 110B may be HEMTs. Any desired type and quantity of first semiconductor devices 110 may be formed in each of the device regions 102D.

The first semiconductor devices 110 may be formed in a front-end of line (FEOL) process by acceptable deposition, photolithography, and etching techniques. For example, the first semiconductor layers 104 may be patterned into a plurality of mesas that each include portions of the first semiconductor layers 104. The first semiconductor layers 104 may be patterned by an etching process, such as a reactive ion etch (RIE), neutral beam etch (NBE), the like, or a combination thereof. The etching may be anisotropic. Additionally, electrodes 106 are formed on the first semiconductor layers 104 of each first semiconductor device 110. The electrodes 106 may be formed of a conductive material, such as titanium, aluminum, nickel, gold, combinations thereof, or the like, which may be formed by a deposition process such as physical vapor deposition (PVD) or CVD, a plating process such as electrolytic or electroless plating, or the like. In some embodiments, each first semiconductor device 110 includes a source electrode 106S, a drain electrode 106D, and a gate electrode 106G on the barrier layer 104C. Additional layers (not separately illustrated), such as dielectric layers, interfacial layers, work function tuning layers, and the like may also be formed. For example, a dielectric layer may be between each gate electrode 106G and barrier layer 104C.

Each first semiconductor device 110 is a discrete device. Specifically, each first semiconductor device 110 includes a buffer layer 104A, a spacer layer 104B, a barrier layer 104C, a source electrode 106S, a drain electrode 106D, and a gate electrode 106G. The first semiconductor devices 110 in each device region 102D (e.g., a semiconductor device 110A and a semiconductor device 110B) are spaced apart from one another.

Figure 3:
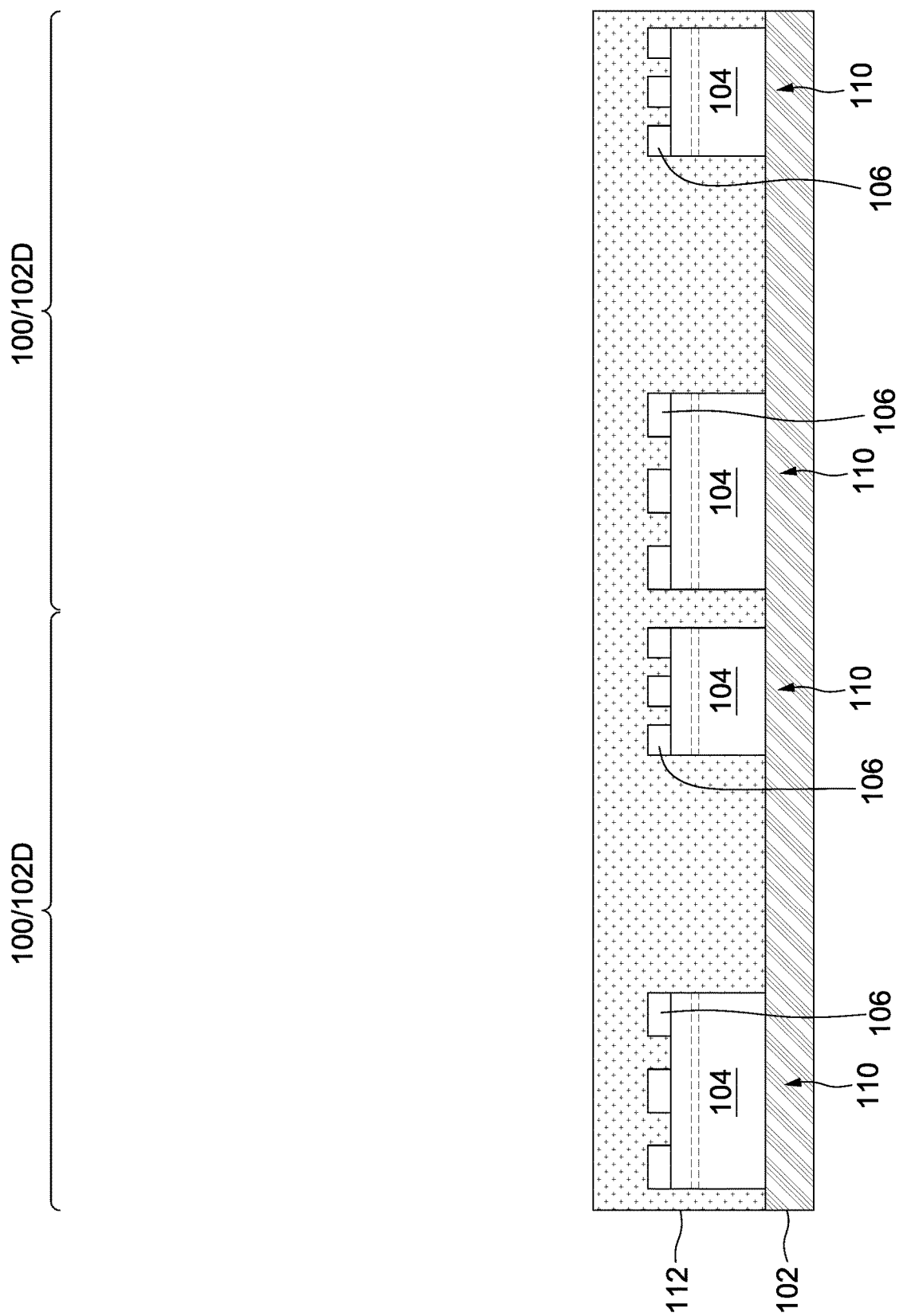

In FIG. 3, a dielectric layer 112 is formed on and around the first semiconductor devices 110. The dielectric layer 112 may bury the first semiconductor devices 110, such that the top surface of the dielectric layer 112 is above the top surfaces of the electrodes 106. Additionally, the dielectric layer 112 is disposed between the first semiconductor devices 110 in each device region 102D (e.g., a semiconductor device 110A and a semiconductor device 110B), such that the first semiconductor devices 110 are separated from one another by portions of the dielectric layer 112. The dielectric layer 112 extends along the sidewalls of the first semiconductor devices 110. The dielectric layer 112 is formed of a dielectric material that provides good isolation for the first semiconductor devices 110. In some embodiments, the dielectric layer 112 is formed of a nitride such as silicon nitride, silicon oxynitride, silicon carbonitride, or the like, which may be formed by a suitable deposition process such as chemical vapor deposition (CVD), atomic layer deposition (ALD), or the like.

Figure 4:
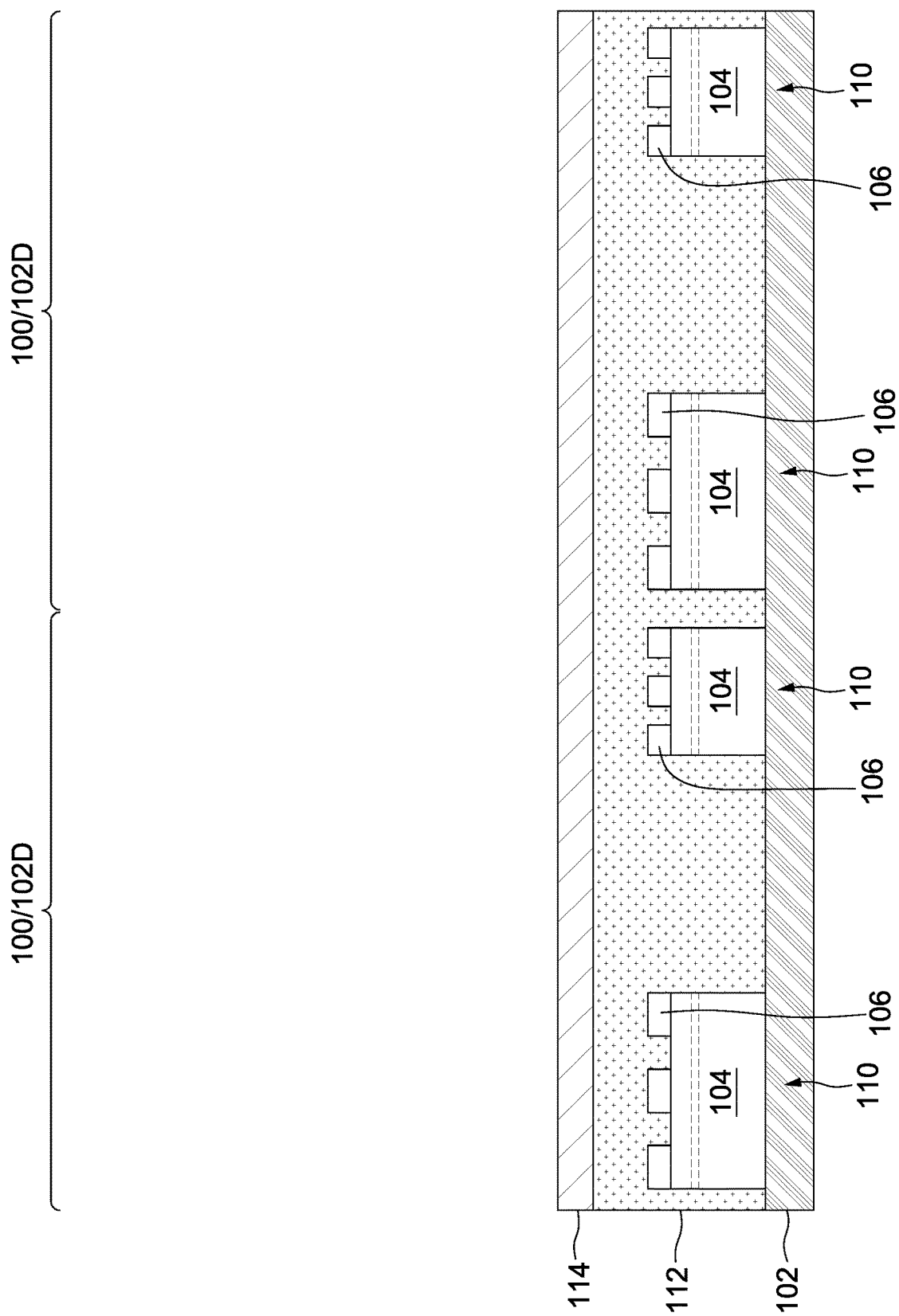

In FIG. 4, an isolation layer 114 is formed on the dielectric layer 112. The isolation layer 114 is formed of a dielectric material, such as a low-k dielectric material (e.g., a dielectric material having a k-value of less than about 3.5, such as in the range of 2.5 to 3.5), which helps improve isolation between the first semiconductor devices 110 and subsequently formed overlying semiconductor devices. The dielectric material of the isolation layer 114 is different from the dielectric material of the dielectric layer 112. The dielectric material of the isolation layer 114 may have a lower k-value than the dielectric material of the dielectric layer 112. In some embodiments, the isolation layer 114 is formed of an oxide such as silicon oxide, silicon oxynitride, silicon oxycarbide, or the like, which may be formed by a suitable deposition process such as chemical vapor deposition (CVD), atomic layer deposition (ALD), or the like.

Figure 5:
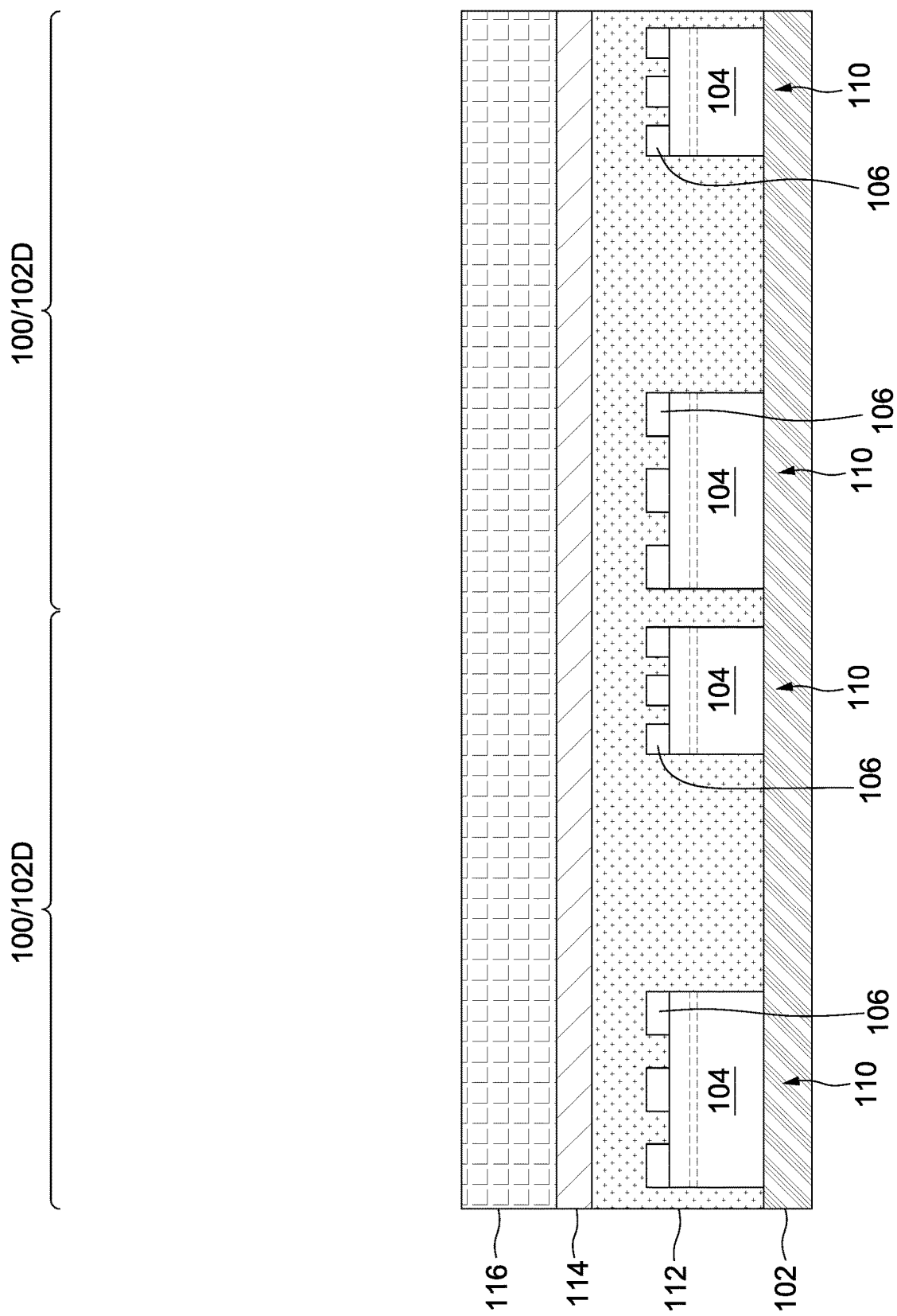

In FIG. 5, a second semiconductor layer 116 is disposed on the isolation layer 114. The second semiconductor layer 116 is formed of a Group IV semiconductor such as silicon, germanium, alloys thereof, or the like. In some embodiments, the second semiconductor layer 116 has a thickness in the range of 5 µm to 10 µm. The second semiconductor layer 116 has an active surface (e.g., the surface facing upwards in FIG. 5) and an inactive surface (e.g., the surface facing downwards in FIG. 5). After formation, the isolation layer 114 is between the second semiconductor layer 116 and the dielectric layer 112. In some embodiments, the isolation layer 114 acts as an interfacial layer, which helps relax stress that would otherwise be imparted on the second semiconductor layer 116 by the dielectric layer 112.

In some embodiments, the second semiconductor layer 116 is formed on the isolation layer 114. The second semiconductor layer 116 may be epitaxially grown from the isolation layer 114 using an epitaxial growth process such as vapor phase epitaxy (VPE), molecular beam epitaxy (MBE), or the like. The second semiconductor layer 116 may be deposited on the isolation layer 114 using a deposition process such as chemical vapor deposition (CVD), atomic layer deposition (ALD), or the like.

In some embodiments, the second semiconductor layer 116 is a semiconductor substrate that is formed separately and then subsequently bonded to the isolation layer 114. For example, the second semiconductor layer 116 may be a wafer that is bonded to the isolation layer 114 through dielectric-to-dielectric bonding, without using any adhesive material (e.g., die attach film). The bonding may include a pre-bonding and an annealing. During the pre-bonding, a small pressing force is applied to press the second semiconductor layer 116 against the isolation layer 114. The pre-bonding is performed at a low temperature, such as about room temperature, such as a temperature in the range of 15° C. to 30° C., and after the pre-bonding, the second semiconductor layer 116 and the isolation layer 114 are bonded to each other. The bonding strength is then improved in a subsequent annealing step, in which the second semiconductor layer 116 and the isolation layer 114 are annealed at a high temperature, such as a temperature in the range of 100° C. to 400° C. After the annealing, direct bonds, such as fusions bonds, are formed bonding the second semiconductor layer 116 to the isolation layer 114. For example, the bonds can be covalent bonds between the material of the isolation layer 114 and the material of the second semiconductor layer 116.

Figure 6:
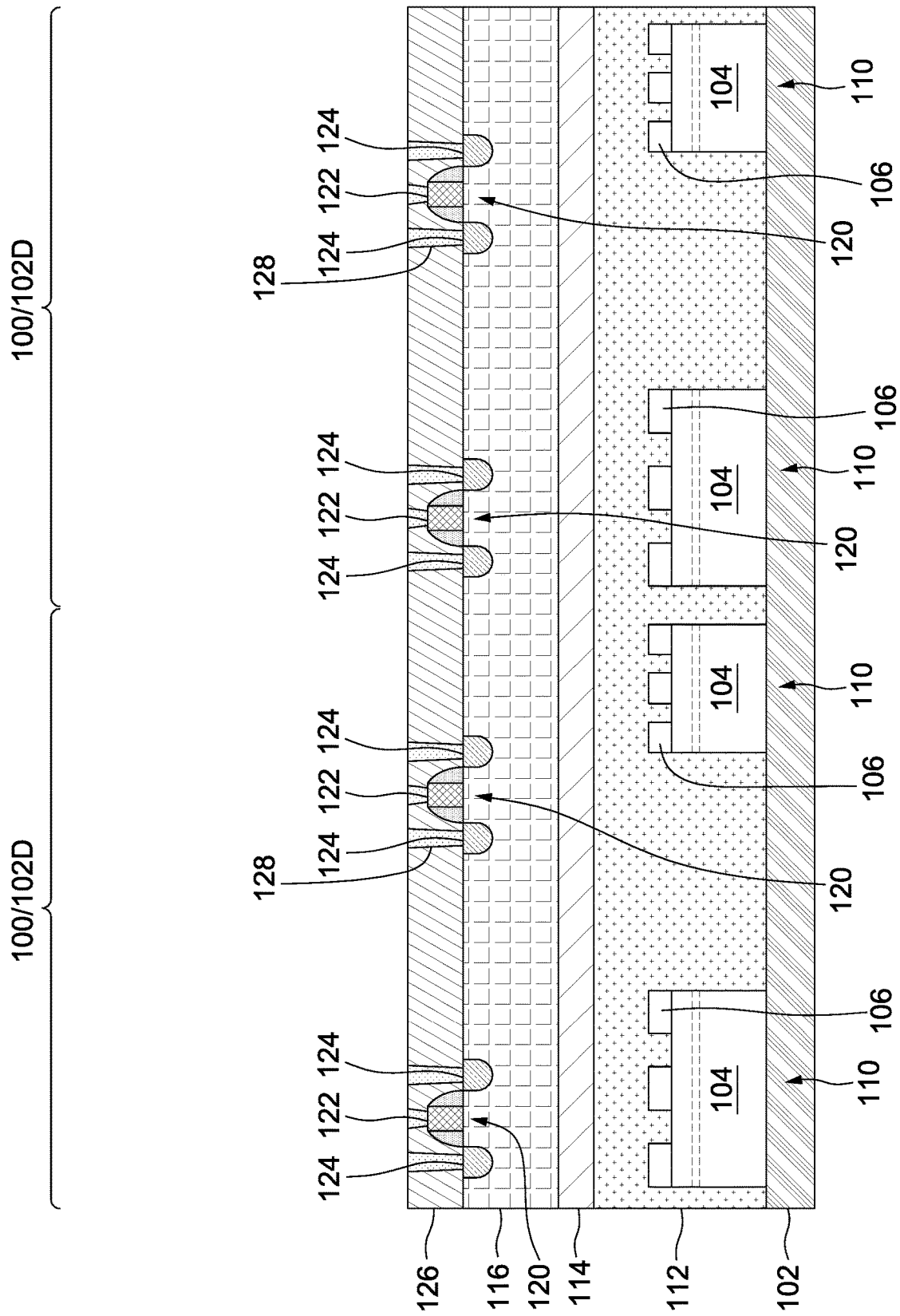

In FIG. 6, second semiconductor devices 120 are formed using the second semiconductor layer 116. The second semiconductor devices 120 are Group IV semiconductor devices, such as silicon devices (e.g., elemental silicon devices, silicon germanium devices, or the like). The second semiconductor devices 120 may be metal-oxide-semiconductor field-effect transistors (MOSFETs), high-voltage metal-oxide-semiconductor (HVMOS) transistors, diodes, or the like. The second semiconductor devices 120 may be low-frequency semiconductor devices, such as devices that have an operating frequency in the range of 1 GHz to 10 GHz, such as an operating frequency of less than about 3.5 GHz. The operating frequency of the second semiconductor devices 120 is less than the operating frequency of the first semiconductor devices 110.

The second semiconductor devices 120 may be formed in a front-end of line (FEOL) process by acceptable deposition, photolithography, and etching techniques. For example, the second semiconductor devices 120 may include gate structures 122 and source/drain regions 124, where the gate structures 122 are on channel regions, and the source/drain regions 124 are adjacent the channel regions. The channel regions may be patterned or unpatterned regions of the second semiconductor layer 116. For example, the channel regions may be regions of semiconductor fins, semiconductor nanosheets, semiconductor nanowires, or the like patterned in the second semiconductor layer 116. As such, the second semiconductor devices 120 may be nanostructure field-effect transistors (Nanostructure-FETs), fin field-effect transistors (FinFETs), planar transistors, or the like. The second semiconductor layer 116 thus comprises the second semiconductor devices 120, which may be in the second semiconductor layer 116. An inter-layer dielectric 126 is formed over the active surface of the second semiconductor layer 116. The inter-layer dielectric 126 surrounds and may cover the second semiconductor devices 120, e.g., the gate structures 122 and/or the source/drain regions 124. The inter-layer dielectric 126 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Further, contacts 128 are formed through the inter-layer dielectric 126 to electrically and physically couple the second semiconductor devices 120. For example, the contacts 128 may include gate contacts and source/drain contacts that are electrically and physically coupled to, respectively, the gate structures 122 and the source/drain regions 124. The contacts 128 may be formed of a suitable conductive material such as tungsten, cobalt, nickel, copper, silver, gold, aluminum, the like, or combinations thereof, which may be formed by a deposition process such as physical vapor deposition (PVD) or CVD, a plating process such as electrolytic or electroless plating, or the like.

The isolation layer 114 is disposed between the first semiconductor devices 110 and the second semiconductor devices 120. Further, the first semiconductor devices 110 are surrounded on all sides by insulating material(s). Specifically, the isolation layer 114 is over the top surfaces of the first semiconductor devices 110, the dielectric layer 112 extends at least along the sidewalls of the first semiconductor devices 110, and the substrate 102 (which may be formed of an insulating material such as sapphire) is under the bottom surfaces of the first semiconductor devices 110. When the first semiconductor devices 110 are high-frequency semiconductor devices and the second semiconductor devices 120 are low-frequency semiconductor devices, the low-frequency semiconductor devices may generate noise during operation, which would impact the performance of high-frequency semiconductor devices. Surrounding the first semiconductor devices 110 on all sides with insulating material(s) helps isolate the first semiconductor devices 110 from the second semiconductor devices 120 during operation, thereby reducing noise and improving performance of the resulting hybrid integrated circuit dies 100.

The second semiconductor devices 120 are formed after the first semiconductor devices 110. The first semiconductor devices 110 incorporate heterojunctions (e.g., between two of the first semiconductor layers 104) and the second semiconductor devices 120 incorporate doped semiconductor regions (e.g., the channel regions and/or the source/drain regions 124). Because the first semiconductor devices 110 do not incorporate doped semiconductor regions, the first semiconductor devices 110 have a high tolerance to heat. As such, the performance of the first semiconductor devices 110 may remain largely unaffected by the process used to form the second semiconductor devices 120.

Figure 7:
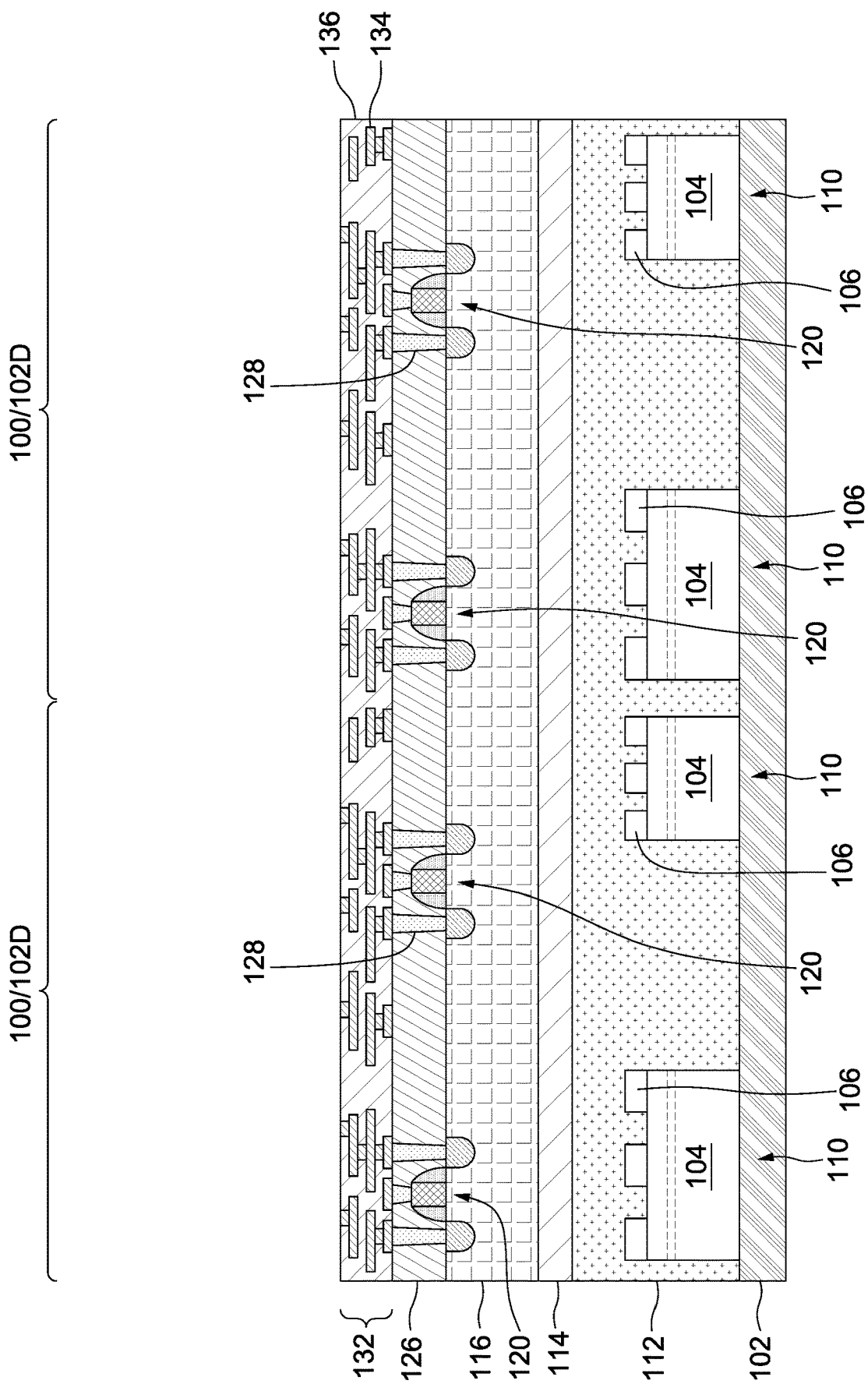

In FIG. 7, an interconnect structure 132 is formed over the active surface of the second semiconductor layer 116, such as on the inter-layer dielectric 126. The interconnect structure 132 may be formed of, for example, metallization patterns 134 in dielectric layers 136. The metallization patterns 134 include metal lines and vias formed in one or more of the dielectric layers 136. The metallization patterns 134 may be formed of a suitable conductive material, such as copper, tungsten, aluminum, silver, gold, a combination thereof, or the like. The interconnect structure 132 includes any desired number of layers of the metallization patterns 134. A bottom layer of the metallization patterns 134 is electrically and physically coupled to the contacts 128. The interconnect structure 132 may be formed by a damascene process, such as a single damascene process, a dual damascene process, or the like.

Figure 8:
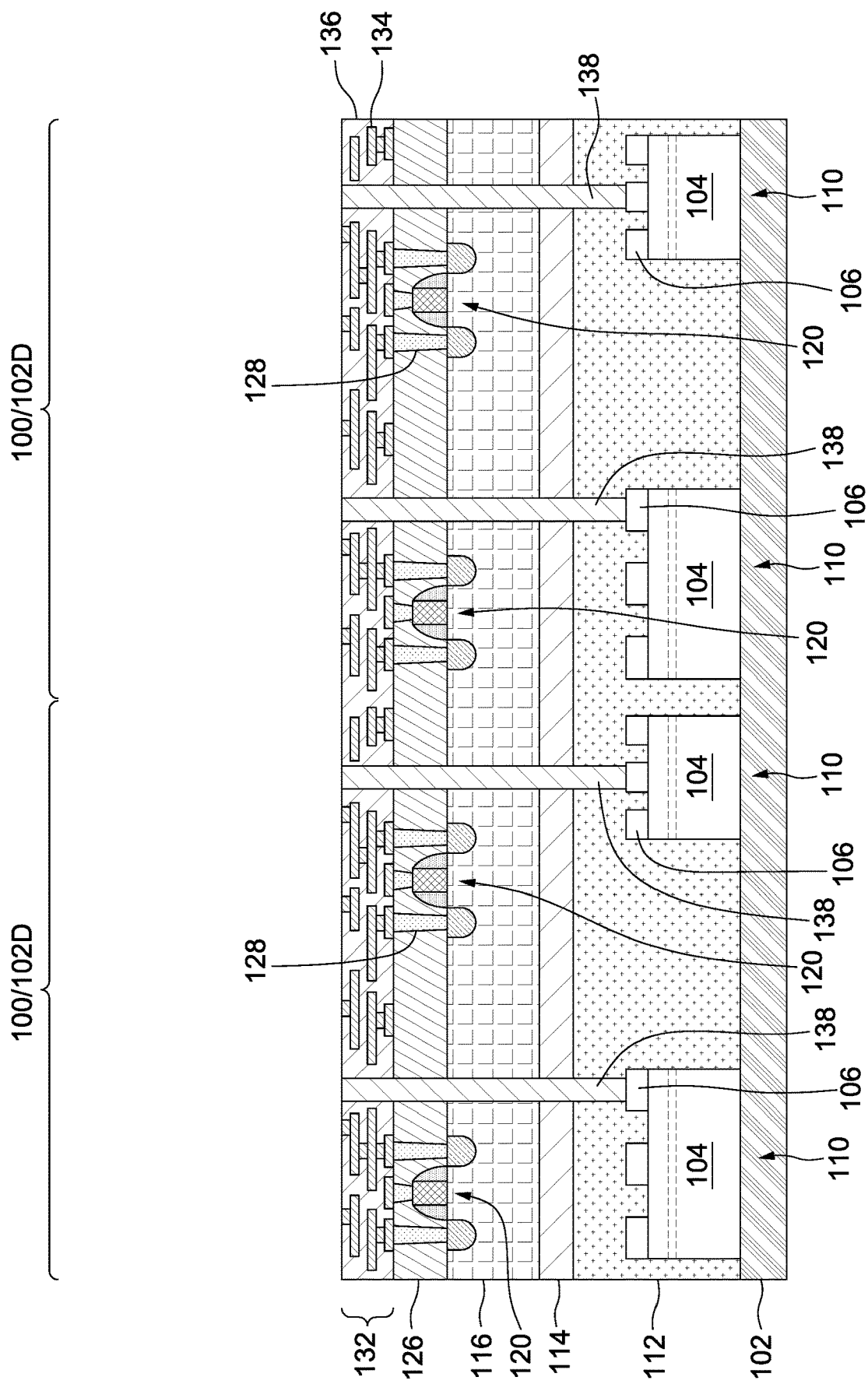

In FIG. 8, through vias 138 are formed to electrically and physically couple the electrodes 106. As will be subsequently described in greater detail, the through vias 138 are electrically coupled to metallization patterns 134 of the interconnect structure 132, such that the metallization patterns 134 are electrically coupled to the first semiconductor devices 110 and the second semiconductor devices 120. The through vias 138 may be through-substrate vias, such as through-silicon vias.

In this embodiment, the through vias 138 are formed by a via-last process, after the second semiconductor devices 120 and the interconnect structure 132 are formed. As such, the through vias 138 extend through the interconnect structure 132, the inter-layer dielectric 126, the second semiconductor layer 116, the isolation layer 114, and the dielectric layer 112. As an example to form the through vias 138 by a via-last process, openings can be formed in the interconnect structure 132, the inter-layer dielectric 126, the second semiconductor layer 116, the isolation layer 114, and the dielectric layer 112 by, for example, etching, milling, laser techniques, a combination thereof, or the like. A thin barrier layer may be conformally deposited in the openings, such as by CVD, atomic layer deposition (ALD), physical vapor deposition (PVD), thermal oxidation, a combination thereof, or the like. The barrier layer may be formed from an oxide, a nitride, a carbide, combinations thereof, or the like. A conductive material may be deposited over the barrier layer and in the openings. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer are removed from a surface of the interconnect structure 132 by, for example, a CMP. The remaining portions of the barrier layer and conductive material in the openings form the through vias 138.

In other embodiments (subsequently described), the through vias 138 are formed by a via-middle process, after the second semiconductor devices 120 are formed and before the interconnect structure 132 is formed. As such, the through vias 138 extend through the inter-layer dielectric 126, the second semiconductor layer 116, the isolation layer 114, and the dielectric layer 112. The via-middle process may be similar to the via-last process, except the openings for the through vias 138 are not formed in the interconnect structure 132.

In still other embodiments (subsequently described), the through vias 138 are formed by a via-first process, before the second semiconductor devices 120 and the interconnect structure 132 are formed. As such, the through vias 138 extend through the second semiconductor layer 116, the isolation layer 114, and the dielectric layer 112. The via-first process may be similar to the via-last process, except the openings are not formed in the interconnect structure 132 or the inter-layer dielectric 126.

Figure 9:
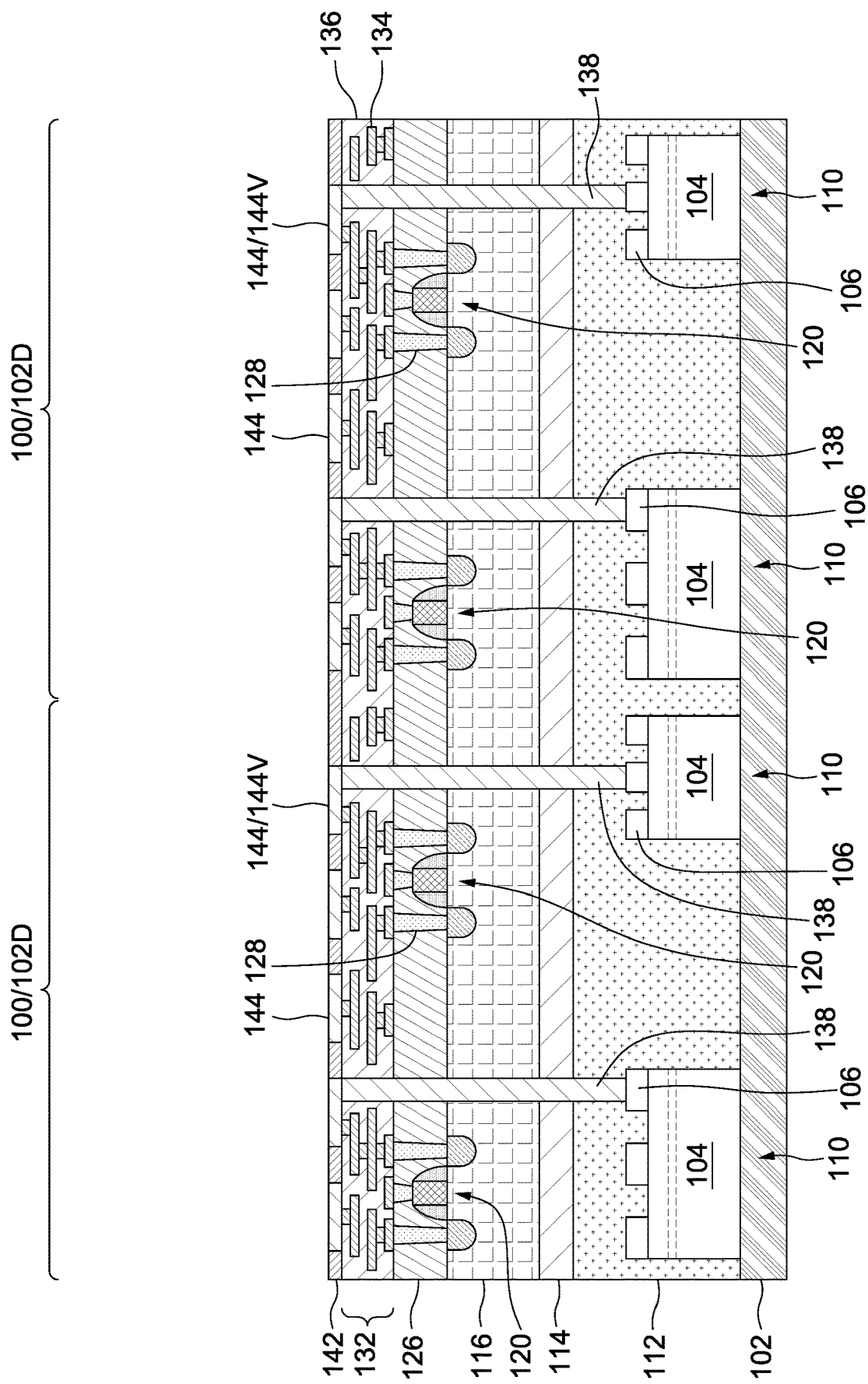

In FIG. 9, a dielectric layer 142 is formed on the interconnect structure 132. The dielectric layer 142 may be formed of silicon oxide, silicon nitride, polybenzoxazole (PBO), polyimide, a benzocyclobuten (BCB) based polymer, the like, or a combination thereof, which may be formed by chemical vapor deposition (CVD), spin coating, lamination, or the like. In some embodiments, the dielectric layer 142 includes a passivation layer and/or a bonding layer on the interconnect structure 132.

Additionally, die connectors 144 are formed in the dielectric layer 142. The die connectors 144 may be conductive pillars, pads, or the like, to which external connections can be made. In some embodiments, the die connectors 144 include bonding pads and vias (not separately illustrated). The die connectors 144 are electrically and physically coupled to an upper metallization pattern 134 of the interconnect structure 132. In this embodiment where the through vias 138 are formed by a via-last process, a subset of the die connectors 144V are also electrically and physically coupled to the through vias 138. The die connectors 144 can be formed of a conductive material, such as a metal, such as copper, aluminum, or the like, which can be formed by, for example, plating, or the like.

The metallization patterns 134 are electrically coupled to the first semiconductor devices 110 (through the contacts 128) and are electrically coupled to the second semiconductor devices 120 (through the die connectors 144V (if present) and the through vias 138). Thus, the first semiconductor devices 110 are electrically coupled to the second semiconductor devices 120 through the contacts 128, the through vias 138, the metallization patterns 134, and the die connectors 144V (if present). The interconnect structure 132 interconnects the first semiconductor devices 110 and the second semiconductor devices 120 to form integrated circuits. Therefore, the resulting hybrid integrated circuit dies 100 include integrated circuits formed from both the first semiconductor devices 110 (e.g., Group III-V semiconductor devices) and the second semiconductor devices 120 (e.g., Group IV semiconductor devices). In some embodiments, the hybrid integrated circuit dies 100 are Bipolar-CMOS-DMOS (BCD) dies, which include bipolar analog components, CMOS digital components, and high-voltage DMOS components, where the bipolar analog components and the high-voltage DMOS components are formed from the first semiconductor devices 110, and the CMOS digital components are formed from the second semiconductor devices 120. For example, an integrated circuit of a hybrid integrated circuit die 100 may include a high-voltage driver (such as a driver having an operating voltage of about 240 volts) and a power management controller for controlling the high-voltage driver. Similarly, an integrated circuit of a hybrid integrated circuit die 100 may include a HEMT for radio frequency (RF) communication and a logic device for controlling the HEMT.

Utilizing the contacts 128, the metallization patterns 134, the through vias 138, and the die connectors 144V (if present) to interconnect the first semiconductor devices 110 and the second semiconductor devices 120 advantageously allows for die-level interconnection of Group III-V semiconductor devices and Group IV semiconductor devices, without utilizing packaging-level features to interconnect the semiconductor devices. Example packaging-level features that may be avoided include solder, conductive bumps, interposers, and package substrates. Avoiding the use of packaging-level features for interconnection may increase signal integrity between the Group III-V semiconductor devices and Group IV semiconductor devices, such as by reducing the signal transmission path length between the semiconductor devices. Reducing the signal transmission path length between the semiconductor devices may reduce parasitic capacitance and may help improve performance matching for some types of devices, such as RF devices. Further, avoiding the use of packaging-level features may simplify device integration, simplify process complexity, and/or improve heat dissipation from the second semiconductor devices 120. The performance of the hybrid integrated circuit dies 100 may thus be improved, and manufacturing costs of the hybrid integrated circuit dies 100 may be decreased.

Figure 10:
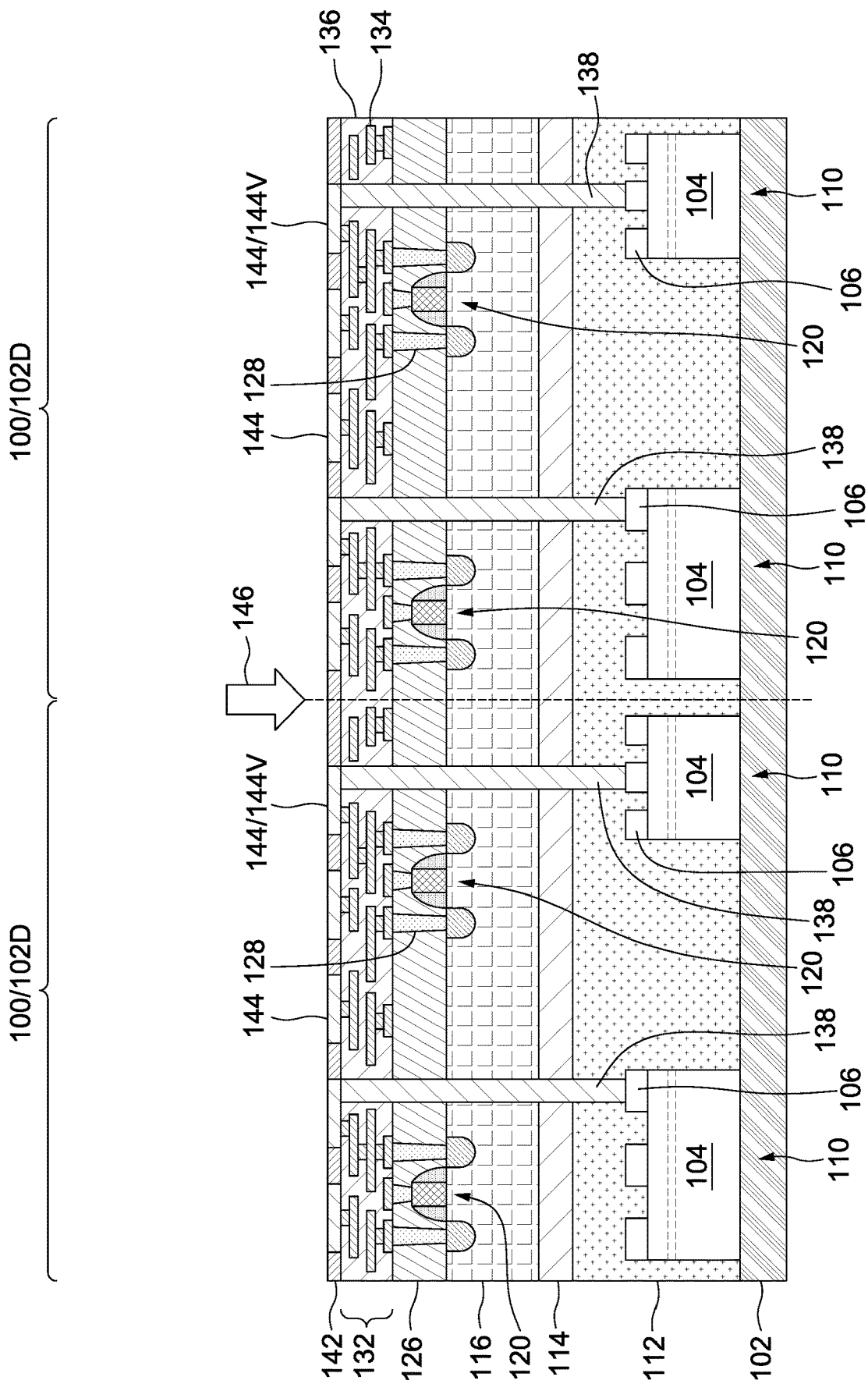

In FIG. 10, a singulation process 146 is performed by along scribe line regions, e.g., between the device regions 102D. The singulation process 146 may include a sawing process, a laser cutting process, or the like. The singulation process 146 singulates the device regions 102D from one another. The resulting, singulated hybrid integrated circuit dies 100 are from the device regions 102D. After the singulation process 146, singulated portions of the substrate 102, the dielectric layer 112, the isolation layer 114, the second semiconductor layer 116, the inter-layer dielectric 126, the interconnect structure 132 (including the dielectric layers 136), and the dielectric layer 142 are laterally coterminous.

Figure 11A:
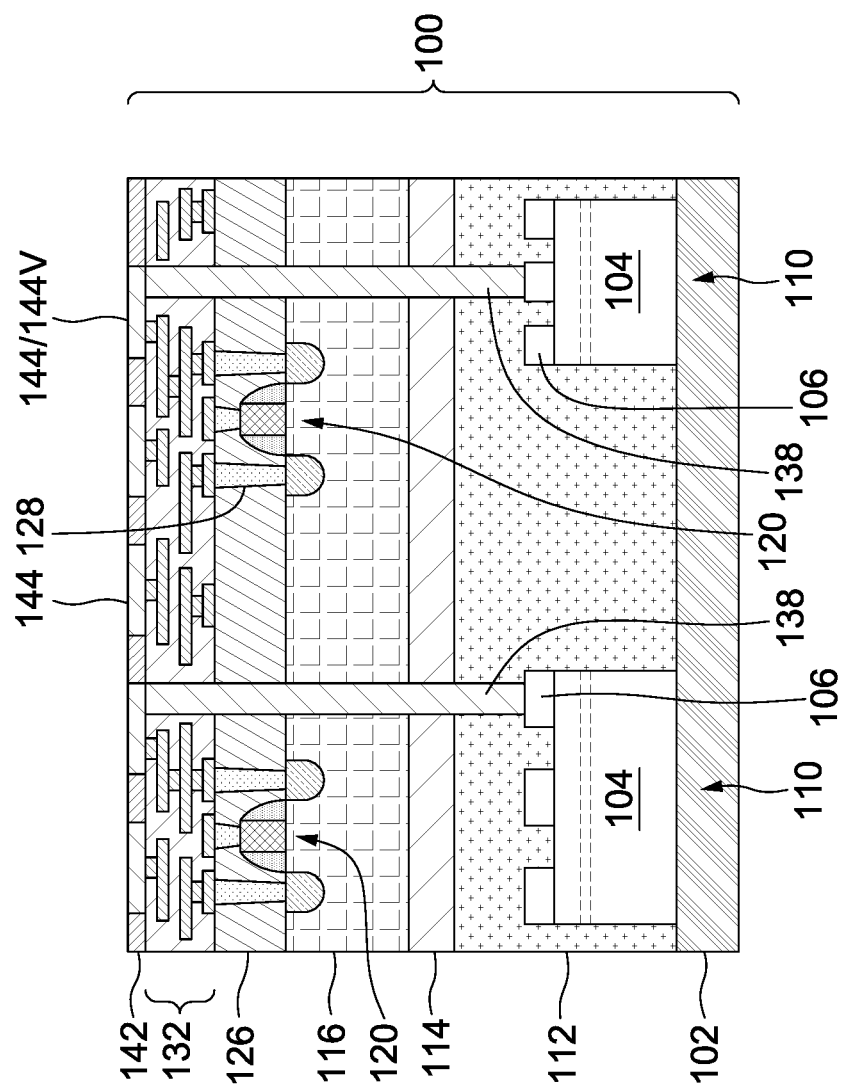
Figure 11B:
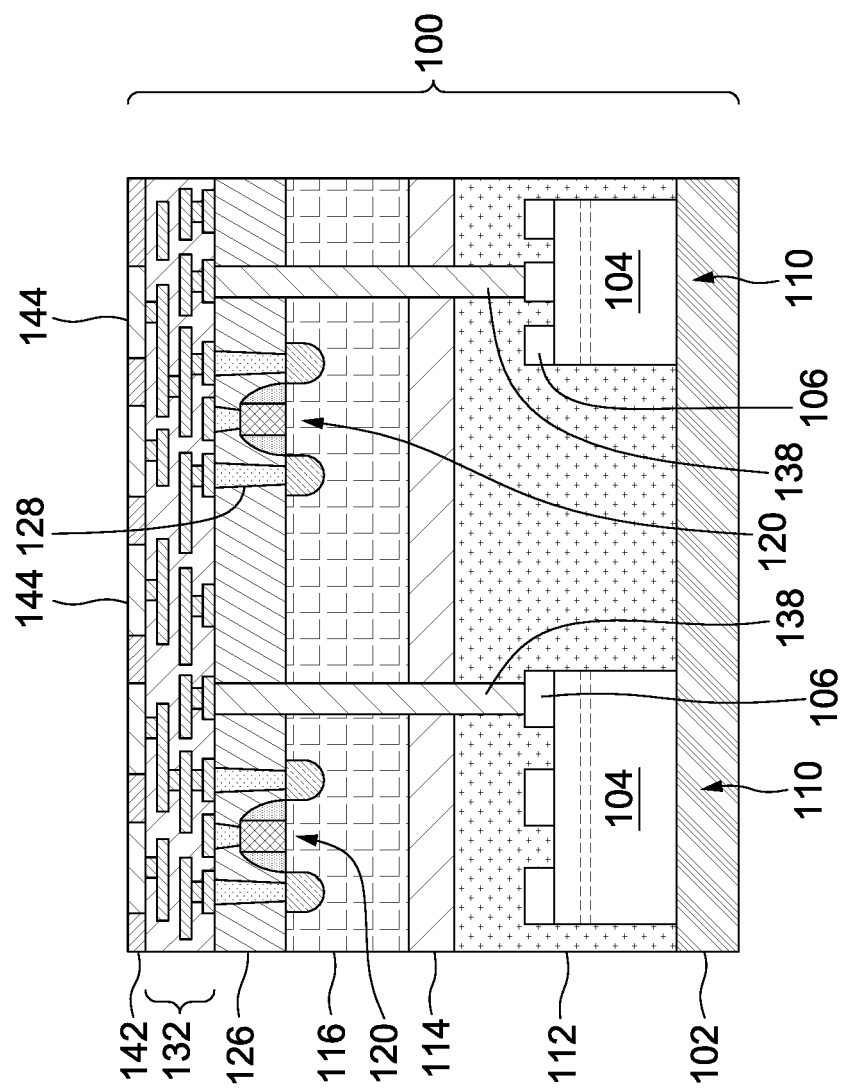

FIGS. 11A-11C are cross-sectional views of hybrid integrated circuit dies 100, in accordance with various embodiments. In these embodiments, each of the through vias 138 in a hybrid integrated circuit die 100 are formed by the same type of process. Additionally, in these embodiments, each through via 138 is a single conductive via that extends through the various layers.

FIG. 11A illustrates an embodiment where each of the through vias 138 are formed by a via-last process. The through vias 138 extend through the interconnect structure 132, the inter-layer dielectric 126, the second semiconductor layer 116, the isolation layer 114, and the dielectric layer 112. The dielectric layer 142 is formed on the through vias 138, and the through vias 138 are electrically and physically coupled to a subset of the die connectors 144V.

FIG. 11B illustrates an embodiment where each of the through vias 138 are formed by a via-middle process. The through vias 138 extend through the inter-layer dielectric 126, the second semiconductor layer 116, the isolation layer 114, and the dielectric layer 112. The interconnect structure 132 is formed on the through vias 138, and the through vias 138 are electrically and physically coupled to a lower metallization pattern 134 of the interconnect structure 132.

FIG. 11C illustrates an embodiment where each of the through vias 138 are formed by a via-first process. The through vias 138 extend through the second semiconductor layer 116, the isolation layer 114, and the dielectric layer 112. The inter-layer dielectric 126 is formed on the through vias 138, and the through vias 138 are electrically and physically coupled to some of the contacts 128 extending through the inter-layer dielectric 126.

Figure 12A:
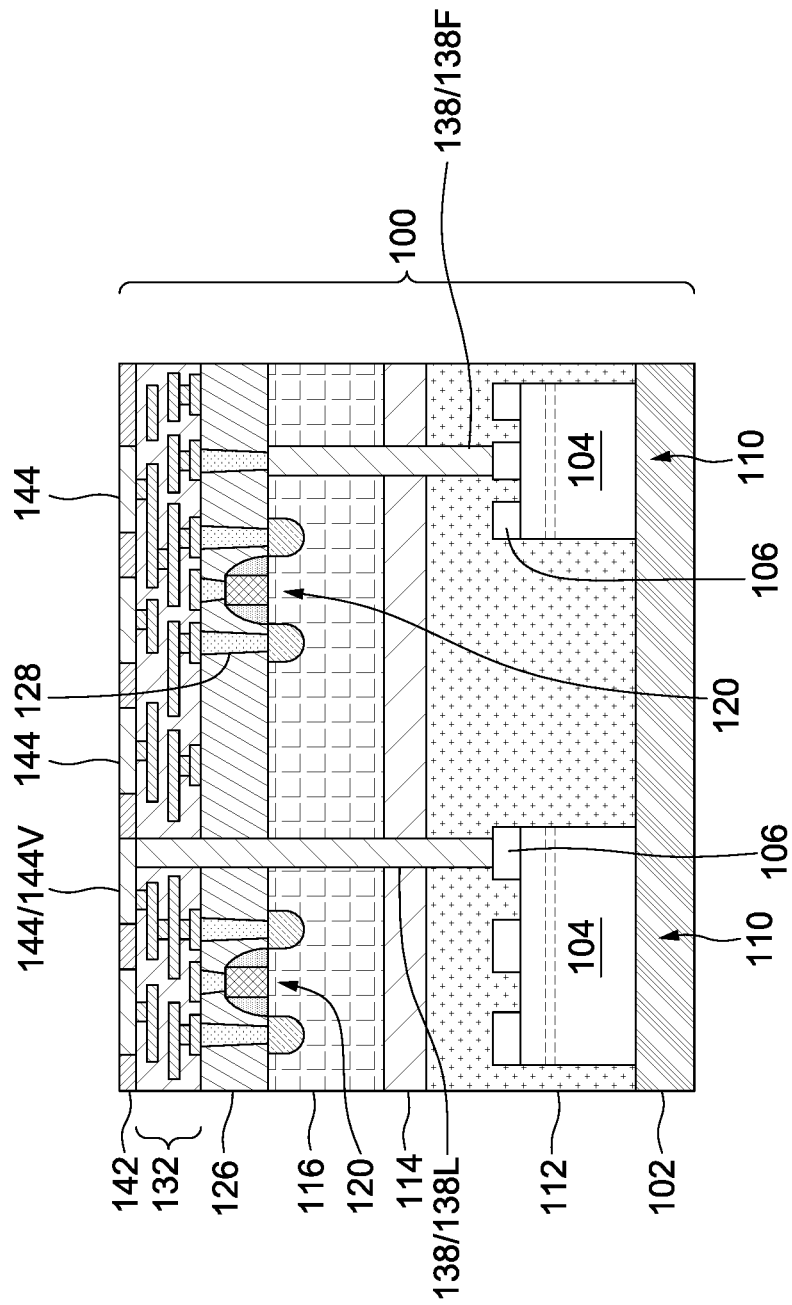
FIGS. 12A-12C are cross-sectional views of hybrid integrated circuit dies, in accordance with various embodiments.
Figure 12B:
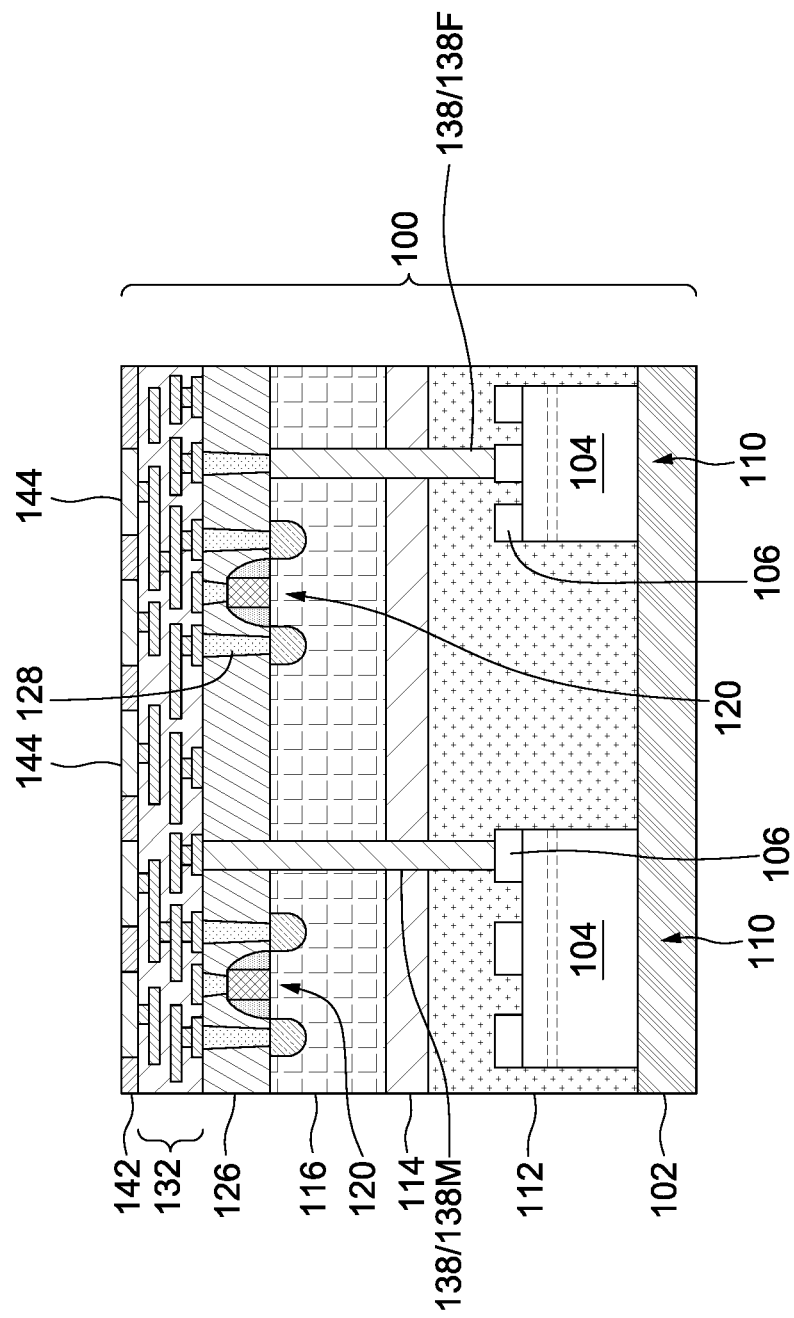
Figure 12C:
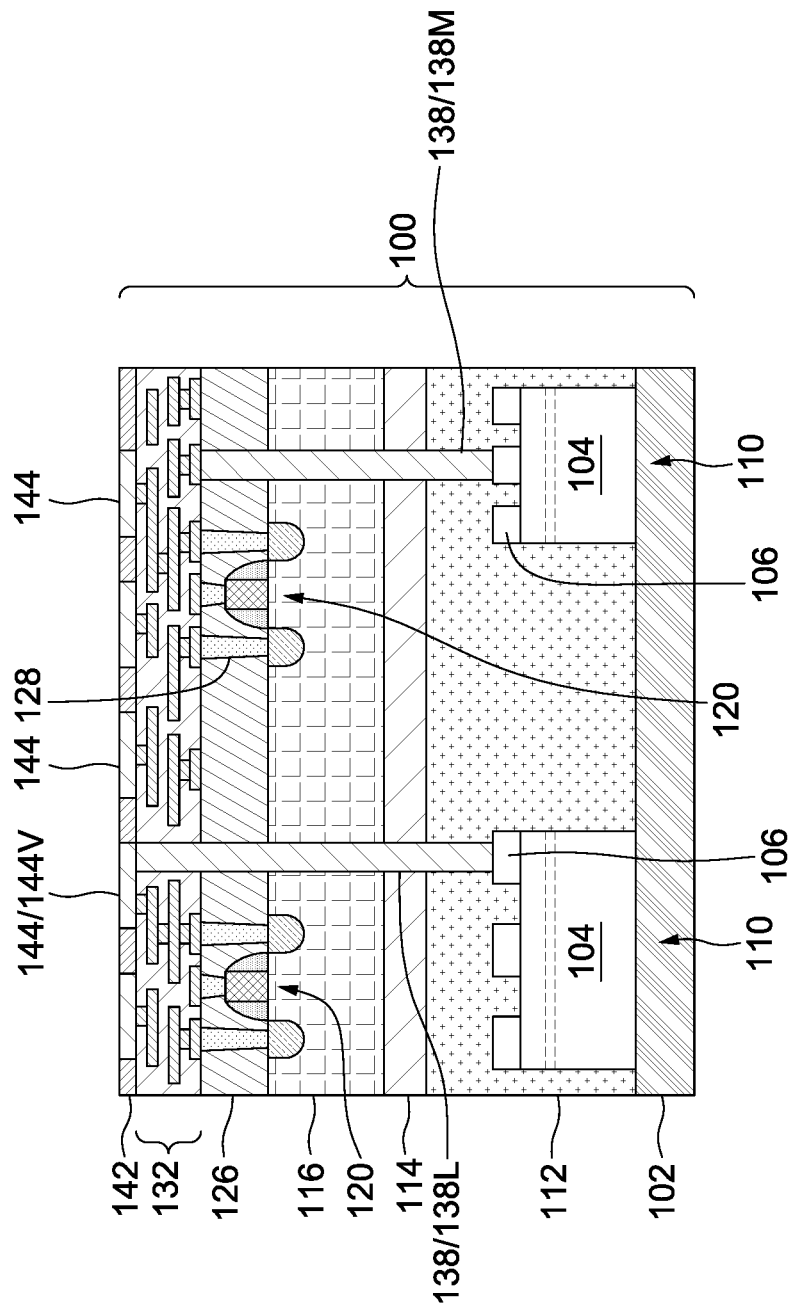

FIGS. 12A-12C are cross-sectional views of hybrid integrated circuit dies 100, in accordance with various embodiments. In these embodiments, some through vias 138 in a hybrid integrated circuit die 100 are formed by one type of process, and other through vias 138 in the hybrid integrated circuit die 100 are formed by another type of process. Additionally, in these embodiments, each through via 138 is a single conductive via that extends through the various layers.

FIG. 12A illustrates an embodiment where a first subset of the through vias 138F are formed by a via-first process, and a second subset of the through vias 138L are formed by a via-last process. The through vias 138L are formed after the through vias 138F. The through vias 138F are electrically and physically coupled to some of the contacts 128 extending through the inter-layer dielectric 126, and the through vias 138L are electrically and physically coupled to a subset of the die connectors 144V.

FIG. 12B illustrates an embodiment where a first subset of the through vias 138F are formed by a via-first process, and a second subset of the through vias 138M are formed by a via-middle process. The through vias 138M are formed after the through vias 138F. The through vias 138F are electrically and physically coupled to some of the contacts 128 extending through the inter-layer dielectric 126, and the through vias 138M are electrically and physically coupled to a lower metallization pattern 134 of the interconnect structure 132.

FIG. 12C illustrates an embodiment where a first subset of the through vias 138M are formed by a via-middle process, and a second subset of the through vias 138L are formed by a via-last process. The through vias 138L are formed after the through vias 138M. The through vias 138M are electrically and physically coupled to a lower metallization pattern 134 of the interconnect structure 132, and the through vias 138L are electrically and physically coupled to a subset of the die connectors 144V.

Figure 13:
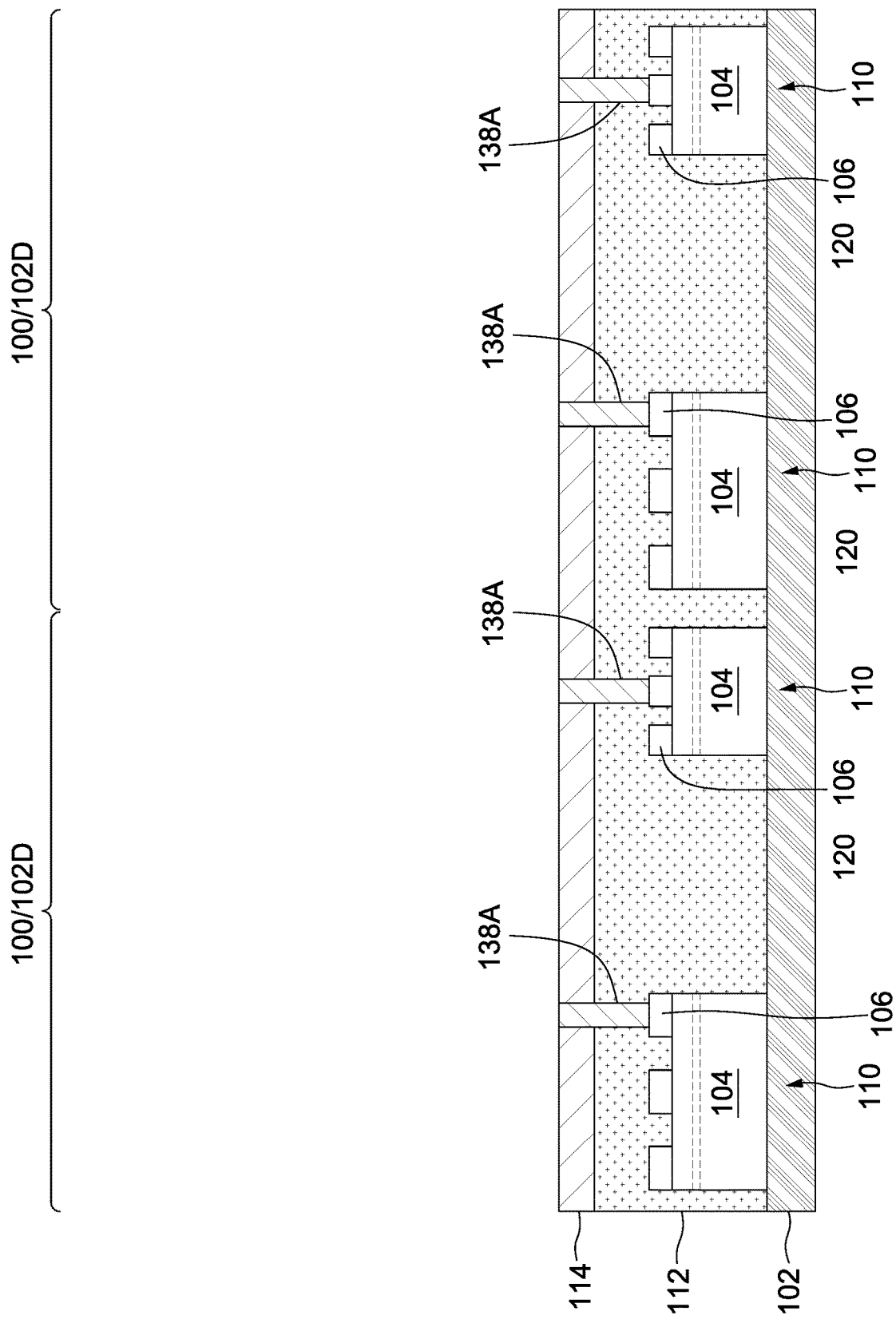
FIGS. 13-14 are cross-sectional views of intermediate stages in the manufacturing of hybrid integrated circuit dies, in accordance with some other embodiments.
Figure 14:
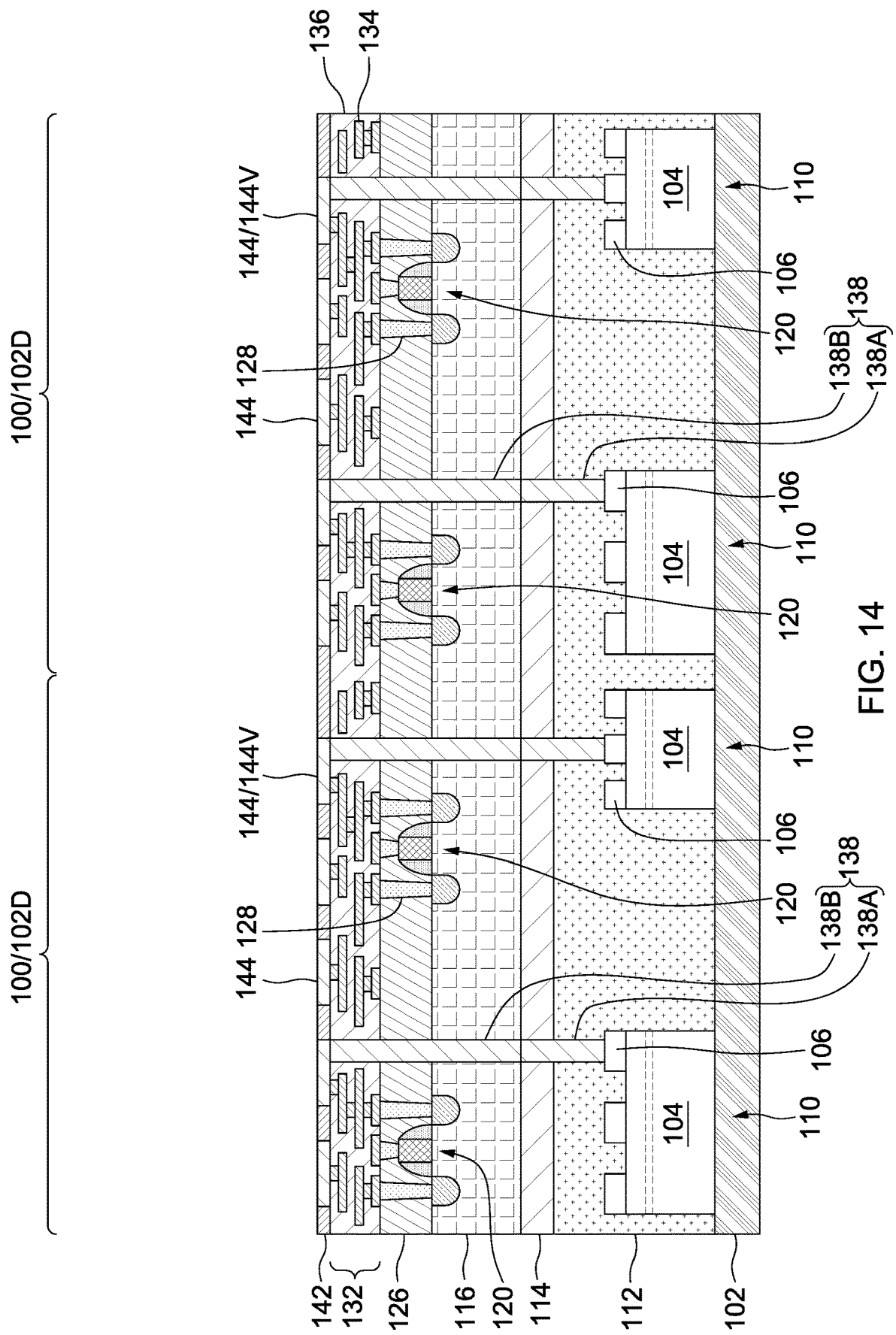

FIGS. 13-14 are cross-sectional views of intermediate stages in the manufacturing of hybrid integrated circuit dies 100, in accordance with some other embodiments. In this embodiment, each through via 138 includes a plurality of conductive vias, such as conductive vias 138A, 138B.

In FIG. 13, the structure described for FIG. 4 is formed or obtained. Conductive vias 138A are then formed through the isolation layer 114 and the dielectric layer 112. As an example to form the conductive vias 138A, openings can be formed in the isolation layer 114 and the dielectric layer 112 by, for example, etching, milling, laser techniques, a combination thereof, or the like. A thin barrier layer may be conformally deposited in the openings, such as by CVD, atomic layer deposition (ALD), physical vapor deposition (PVD), thermal oxidation, a combination thereof, or the like. The barrier layer may be formed from an oxide, a nitride, a carbide, combinations thereof, or the like. A conductive material may be deposited over the barrier layer and in the openings. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer are removed from a surface of the isolation layer 114 by, for example, a CMP. The remaining portions of the barrier layer and conductive material in the openings form the conductive vias 138A.

In FIG. 14, appropriate processing steps as described above are performed to form the second semiconductor devices 120, the inter-layer dielectric 126, the contacts 128, and the interconnect structure 132. Conductive vias 138B are then formed extending through the interconnect structure 132, the inter-layer dielectric 126, and the second semiconductor layer 116. Each conductive via 138B is formed on a respective conductive via 138A, and each pair of a conductive via 138A and a conductive via 138B forms a through via 138. Subsequently, appropriate processing steps as described above may be performed to complete formation of the hybrid integrated circuit dies 100.

In this embodiment, the conductive vias 138B are formed by a via-last process, after the second semiconductor devices 120 and the interconnect structure 132 are formed. As such, the conductive vias 138B extend through the interconnect structure 132, the inter-layer dielectric 126, and the second semiconductor layer 116. As an example to form the conductive vias 138B by a via-last process, openings can be formed in the interconnect structure 132, the inter-layer dielectric 126, and the second semiconductor layer 116 by, for example, etching, milling, laser techniques, a combination thereof, or the like. A thin barrier layer may be conformally deposited in the openings, such as by CVD, atomic layer deposition (ALD), physical vapor deposition (PVD), thermal oxidation, a combination thereof, or the like. The barrier layer may be formed from an oxide, a nitride, a carbide, combinations thereof, or the like. A conductive material may be deposited over the barrier layer and in the openings. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer are removed from a surface of the interconnect structure 132 by, for example, a CMP. The remaining portions of the barrier layer and conductive material in the openings form the conductive vias 138B.

In other embodiments (subsequently described), the conductive vias 138B are formed by a via-middle process, after the second semiconductor devices 120 are formed and before the interconnect structure 132 is formed. As such, the conductive vias 138B extend through the inter-layer dielectric 126 and the second semiconductor layer 116. The via-middle process may be similar to the via-last process, except the openings for the conductive vias 138B are not formed in the interconnect structure 132.

In still other embodiments (subsequently described), the conductive vias 138B are formed by a via-first process, before the second semiconductor devices 120 and the interconnect structure 132 are formed. As such, the conductive vias 138B extend through the second semiconductor layer 116. The via-first process may be similar to the via-last process, except the openings are not formed in the interconnect structure 132 or the inter-layer dielectric 126.

Figure 15A:
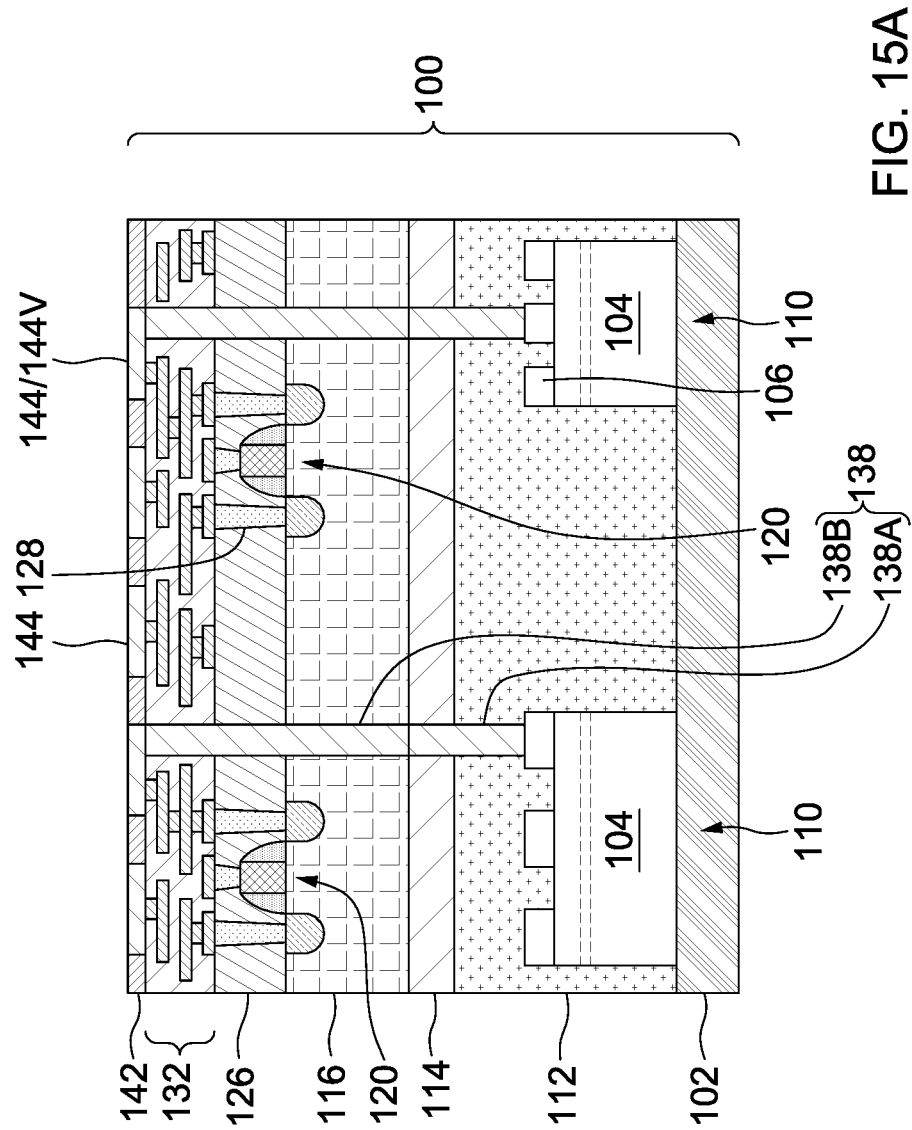
FIGS. 15A-15C are cross-sectional views of hybrid integrated circuit dies, in accordance with various embodiments.
Figure 15B:
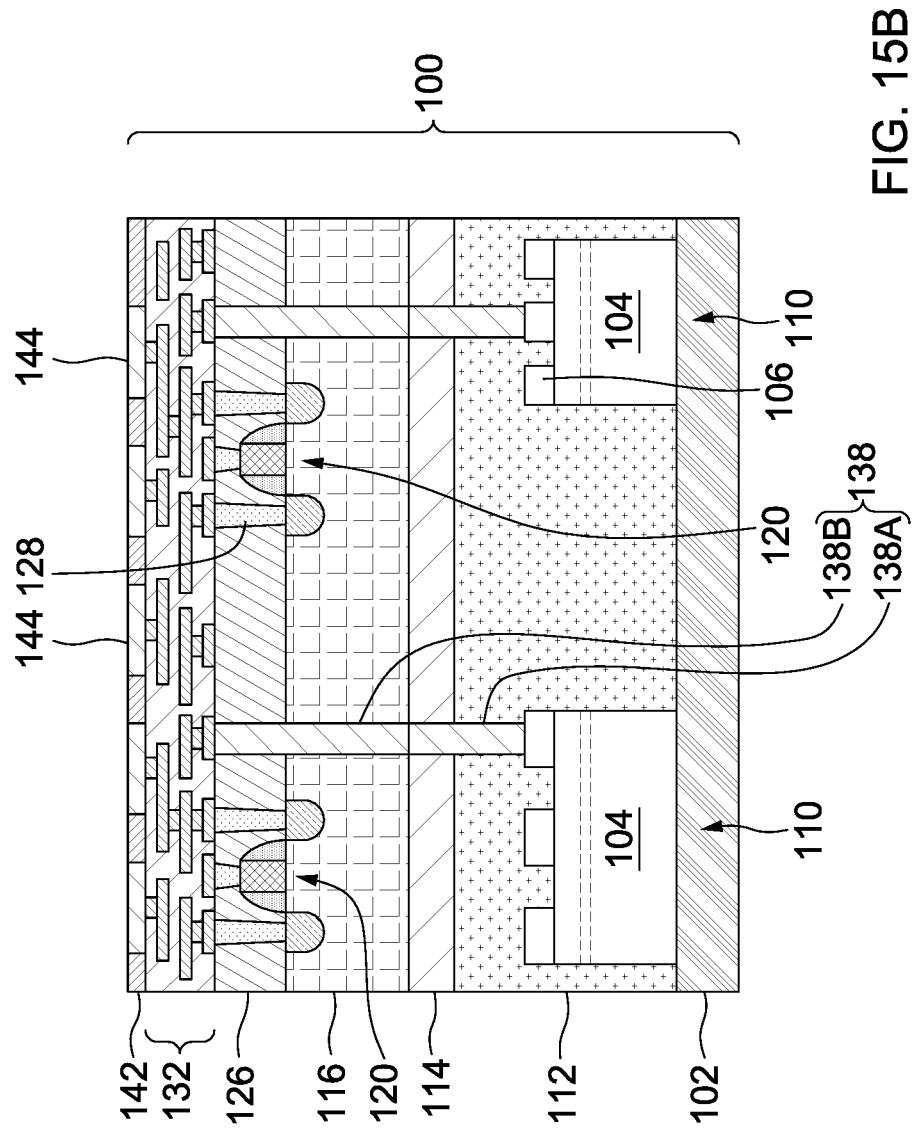
Figure 15C:
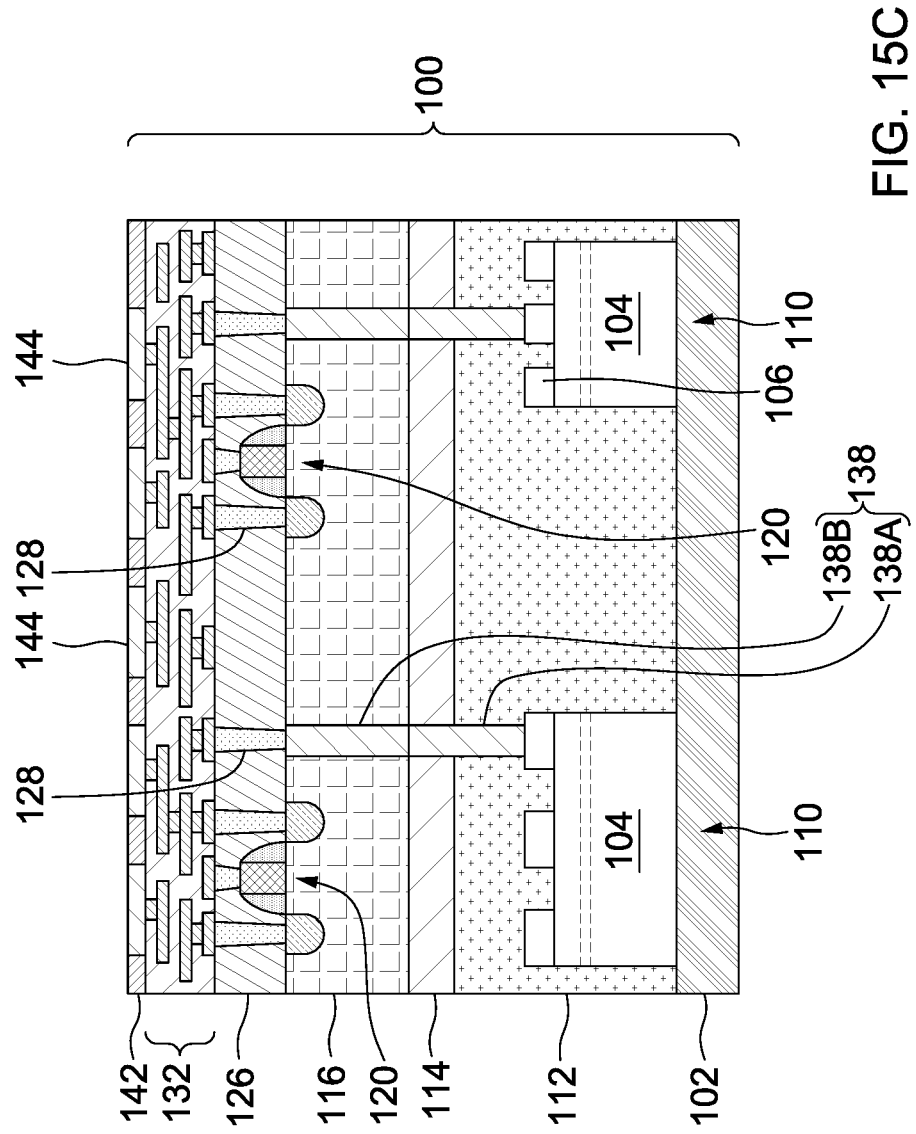

FIGS. 15A-15C are cross-sectional views of hybrid integrated circuit dies 100, in accordance with various embodiments. In these embodiments, each through via 138 includes a conductive via 138A and a conductive via 138B. Additionally, in these embodiments, each of the conductive vias 138A, 138B in a hybrid integrated circuit die 100 are formed by the same type of process.

FIG. 15A illustrates an embodiment where each of the conductive vias 138B are formed by a via-last process. The conductive vias 138B extend through the interconnect structure 132, the inter-layer dielectric 126, and the second semiconductor layer 116. The dielectric layer 142 is formed on the conductive vias 138B, and the conductive vias 138B are electrically and physically coupled to a subset of the die connectors 144V.

FIG. 15B illustrates an embodiment where each of the conductive vias 138B are formed by a via-middle process. The conductive vias 138B extend through the inter-layer dielectric 126 and the second semiconductor layer 116. The interconnect structure 132 is formed on the conductive vias 138B, and the conductive vias 138B are electrically and physically coupled to a lower metallization pattern 134 of the interconnect structure 132.

FIG. 15C illustrates an embodiment where each of the conductive vias 138B are formed by a via-first process. The conductive vias 138B extend through the second semiconductor layer 116. The inter-layer dielectric 126 is formed on the conductive vias 138B, and the conductive vias 138B are electrically and physically coupled to some of the contacts 128 extending through the inter-layer dielectric 126.

Figure 16A:
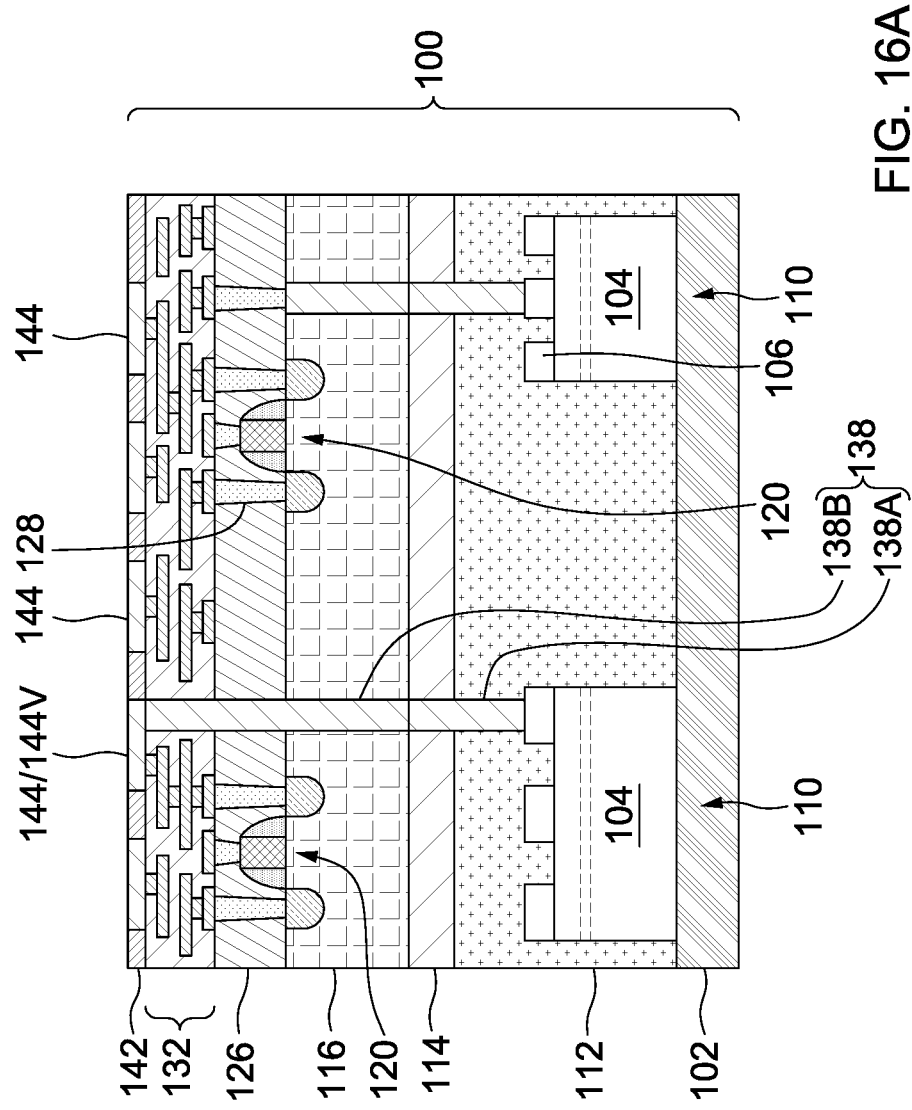
FIGS. 16A-16C are cross-sectional views of hybrid integrated circuit dies, in accordance with various embodiments.
Figure 16B:
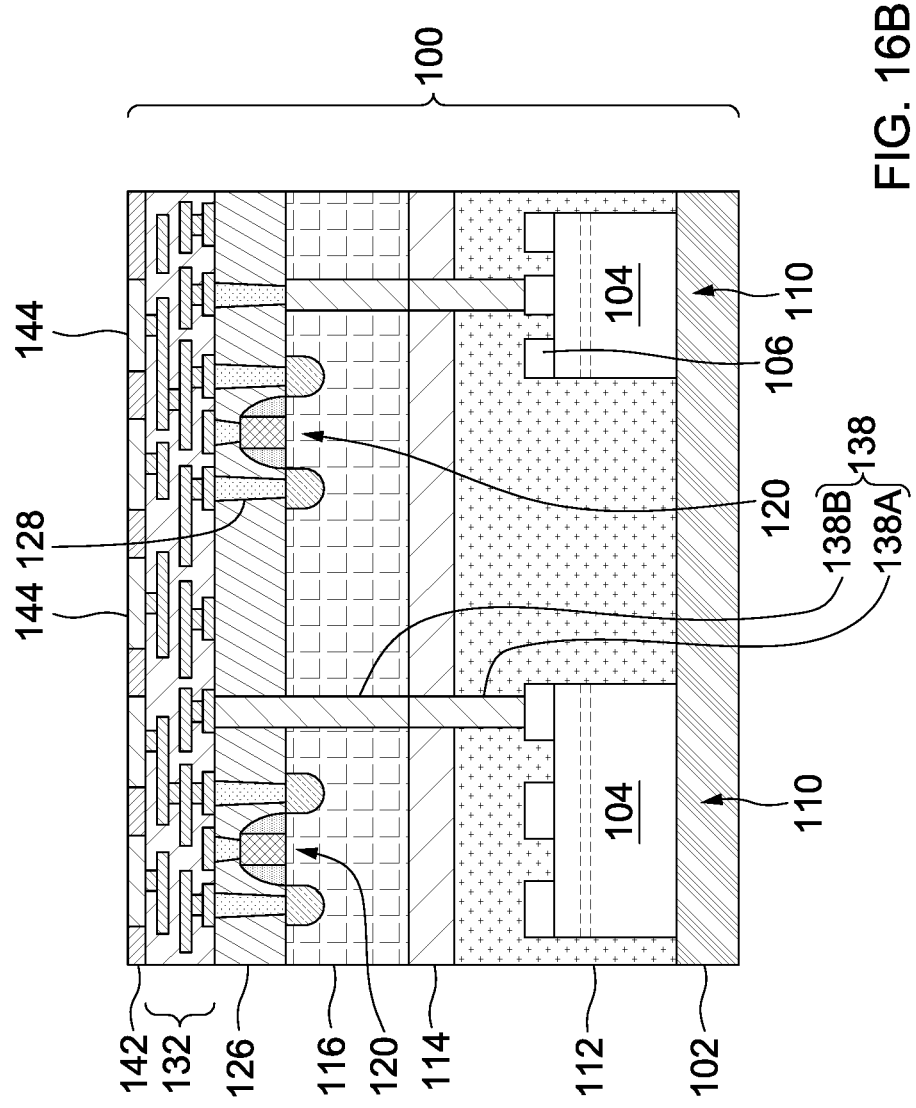
Figure 16C:
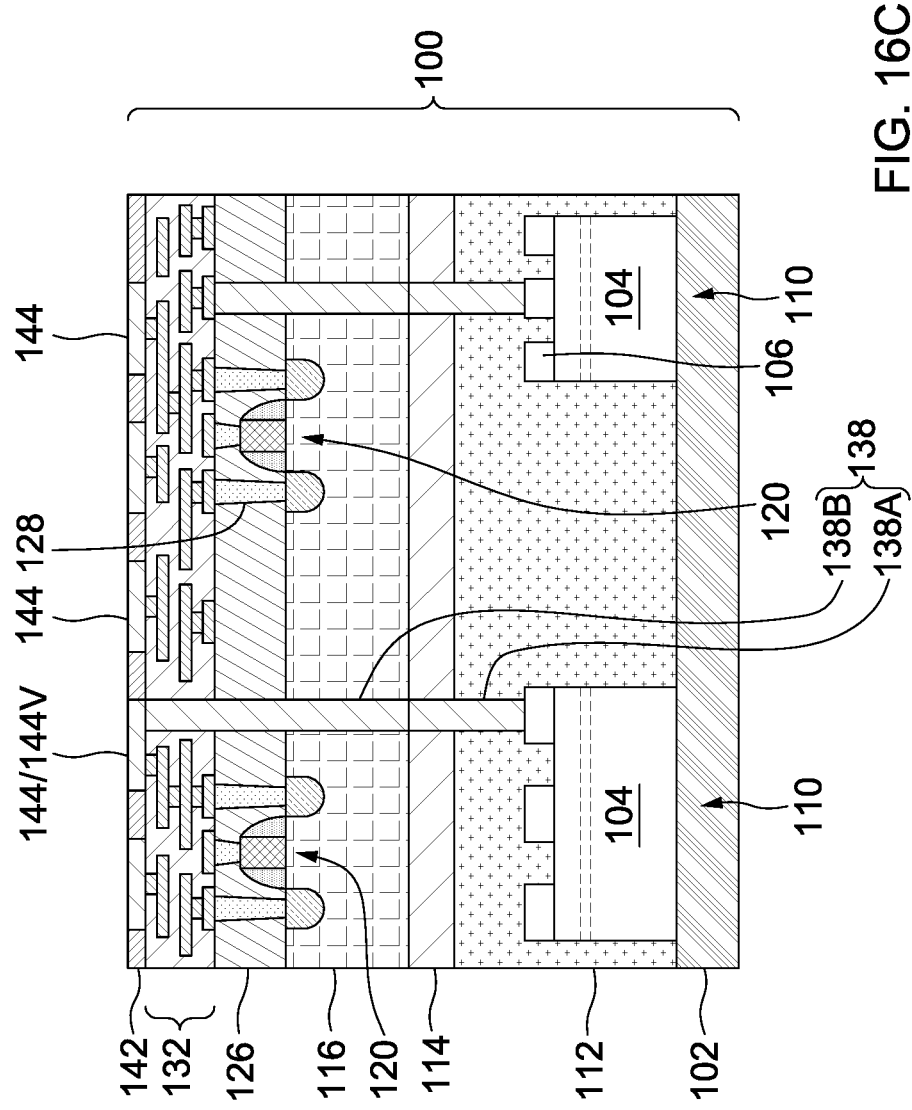

FIGS. 16A-16C are cross-sectional views of hybrid integrated circuit dies 100, in accordance with various embodiments. These embodiments are similar to the embodiments of FIGS. 12A-12C, respectively, except each through via 138 includes a conductive via 138A and a conductive via 138B. The conductive vias 138B of each of these embodiments may be formed using an appropriate process as previously described.

Figure 17:
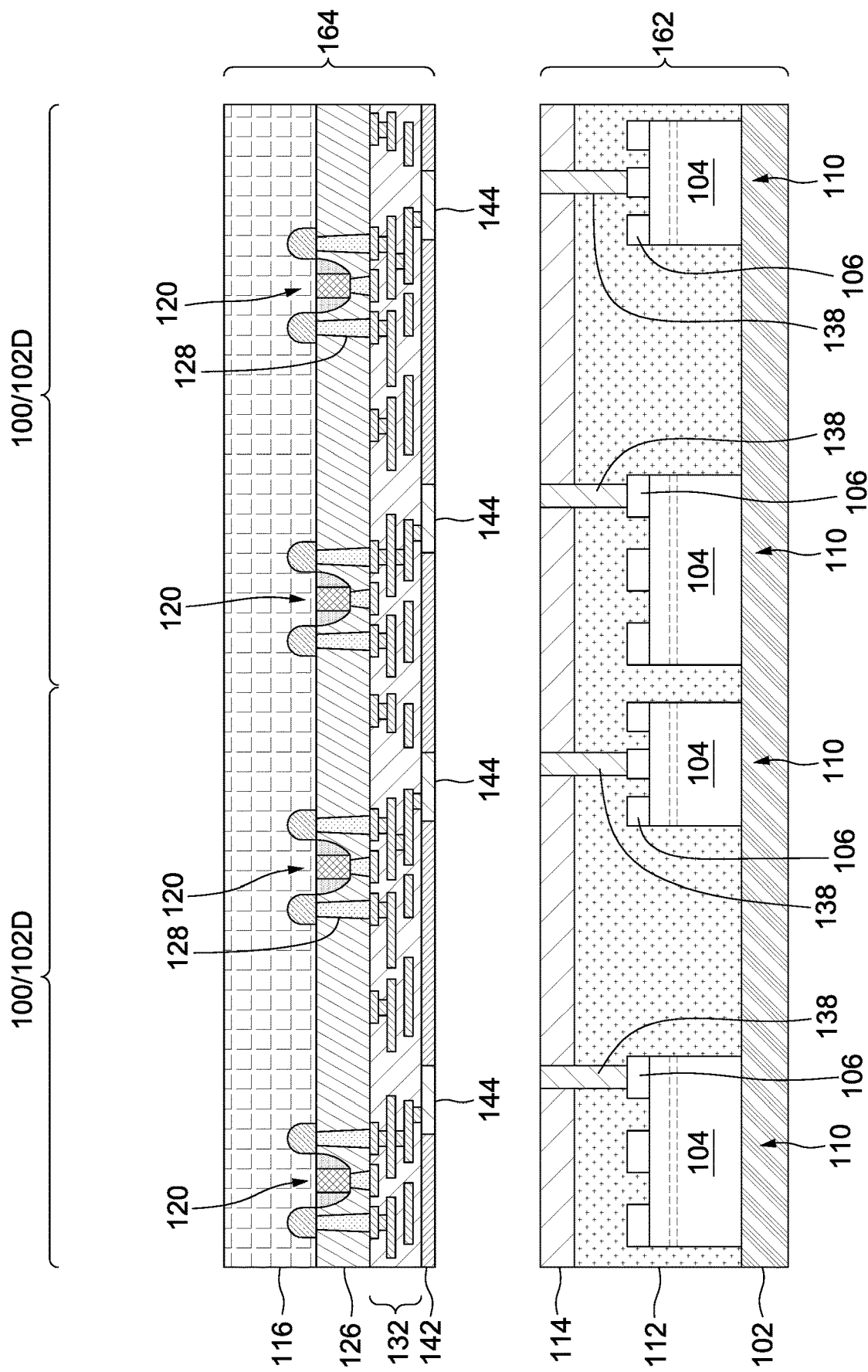
FIGS. 17-19 are cross-sectional views of intermediate stages in the manufacturing of hybrid integrated circuit dies, in accordance with some other embodiments.
Figure 18:
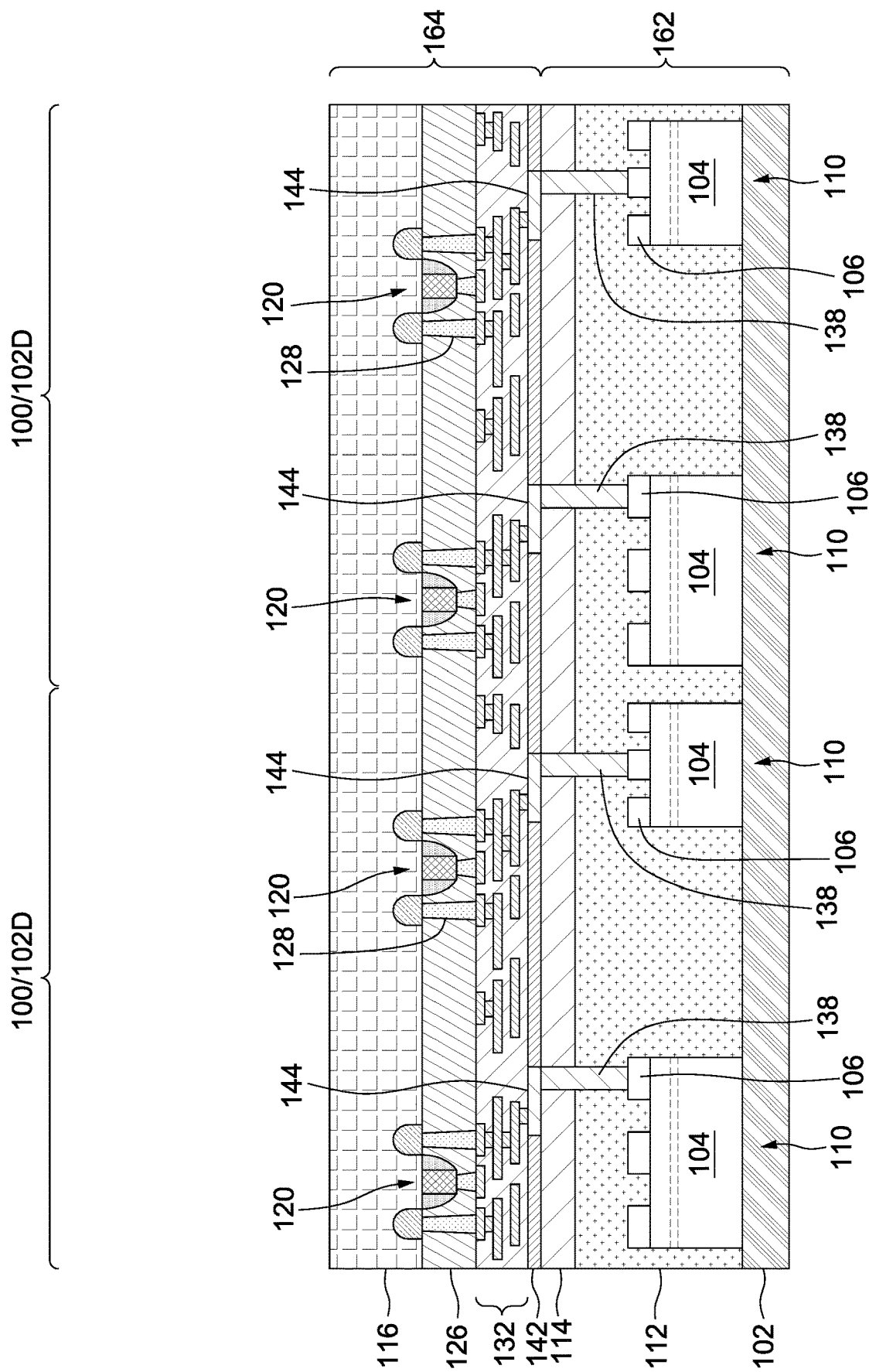
Figure 19:
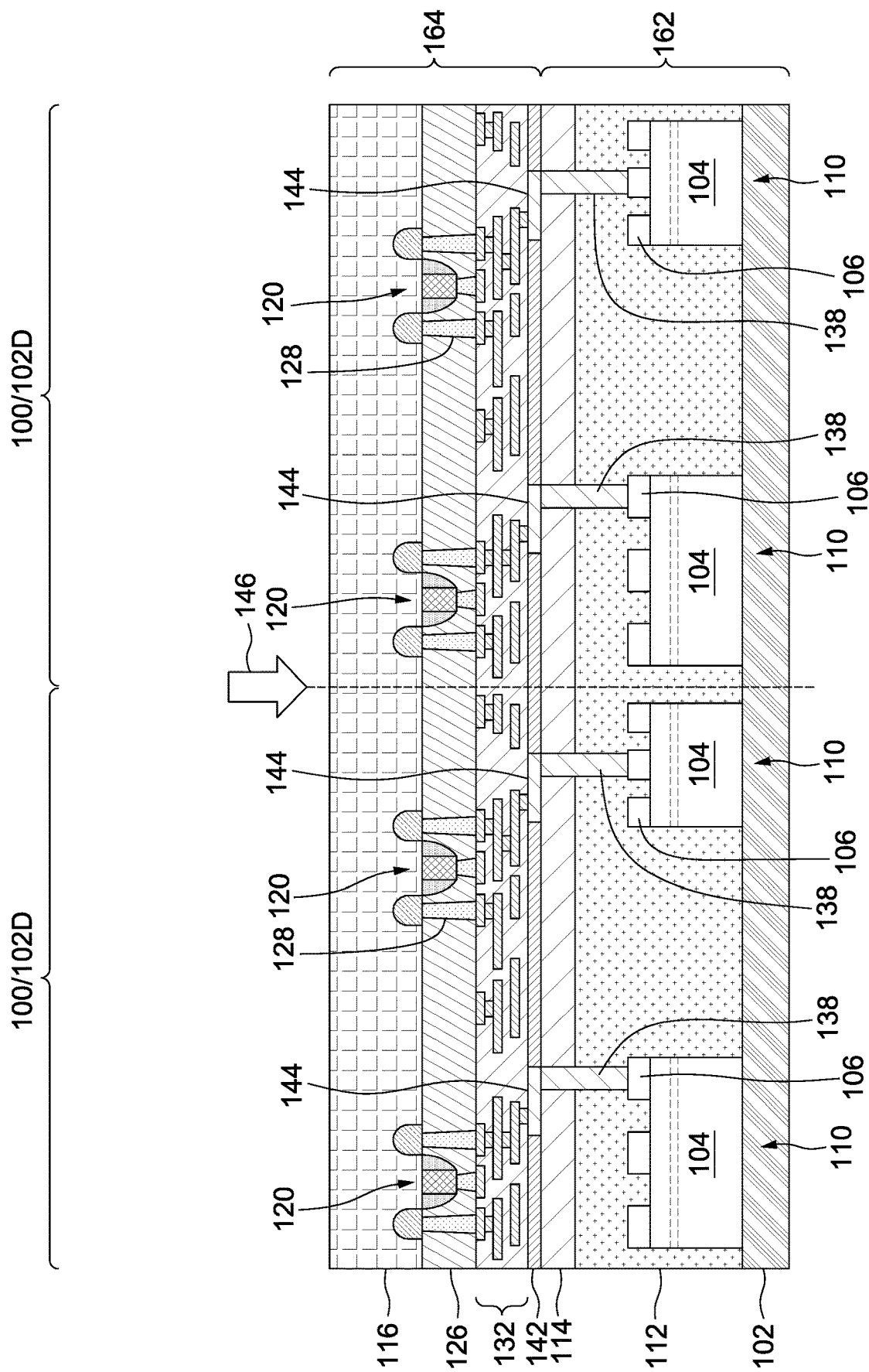

FIGS. 17-19 are cross-sectional views of intermediate stages in the manufacturing of hybrid integrated circuit dies 100, in accordance with some other embodiments. In this embodiment, the first semiconductor devices 110 and the second semiconductor devices 120 are formed in different wafers, e.g., a first wafer 162 and a second wafer 164, respectively. The first wafer 162 and the second wafer 164 will be bonded together in a wafer-to-wafer bonding process to form the hybrid integrated circuit dies 100.

In FIG. 17, a first wafer 162 and a second wafer 164 are formed or obtained. The first wafer 162 is similar to the structure described for FIG. 13, including the substrate 102, the first semiconductor devices 110, and through vias 138. The second wafer 164 is similar to the upper portion of the structure described for FIG. 9, including the second semiconductor layer 116, the second semiconductor devices 120, the inter-layer dielectric 126, the contacts 128, the interconnect structure 132, the dielectric layer 142, and the die connectors 144, except the second wafer 164 does not include conductive vias. The second semiconductor layer 116 in this embodiment may be a semiconductor substrate.

In FIG. 18, the first wafer 162 is bonded to the second wafer 164 in a wafer-to-wafer bonding process. Specifically, the first wafer 162 is bonded to the second wafer 164 in a face-to-face manner. As such, the front side of the first wafer 162 is bonded to the front side of the second wafer 164.

As an example of the wafer-to-wafer bonding process, the first wafer 162 may be bonded to the second wafer 164 by hybrid bonding. The isolation layer 114 is bonded to the dielectric layer 142 through dielectric-to-dielectric bonding, without using any adhesive material (e.g., die attach film), and the through vias 138 are bonded to the die connectors 144 through metal-to-metal bonding, without using any eutectic material (e.g., solder). The bonding may include a pre-bonding and an annealing. During the pre-bonding, a small pressing force is applied to press the wafers against one another. The pre-bonding is performed at a low temperature, such as about room temperature, such as a temperature in the range of 15° C. to 30° C., and after the pre-bonding, the dielectric layer 142 and the isolation layer 114 are bonded to each other. The bonding strength is then improved in a subsequent annealing step, in which the dielectric layer 142, the isolation layer 114, the die connectors 144, and the through vias 138 are annealed at a high temperature, such as a temperature in the range of 100° C. to 400° C. After the annealing, bonds, such as fusions bonds, are formed bonding the dielectric layer 142 and the isolation layer 114. For example, the bonds can be covalent bonds between the material of the isolation layer 114 and the material of the dielectric layer 142. The die connectors 144 and the through vias 138 are connected to each other with a one-to-one correspondence. The die connectors 144 and the through vias 138 may be in physical contact after the pre-bonding, or may expand to be brought into physical contact during the annealing. Further, during the annealing, the material of the die connectors 144 and the through vias 138 (e.g., copper) intermingles, so that metal-to-metal bonds are also formed. Hence, the resulting bonds between the wafers are hybrid bonds that include both dielectric-to-dielectric bonds and metal-to-metal bonds.

In FIG. 19, a singulation process 146 is performed by along scribe line regions, e.g., between the device regions 102D. The singulation process 146 may include a sawing process, a laser cutting process, or the like. The singulation process 146 singulates the device regions 102D from one another. The resulting, singulated hybrid integrated circuit dies 100 are from the device regions 102D. After the singulation process 146, singulated portions of the first wafer 162 and the second wafer 164 are laterally coterminous.

Figure 20:
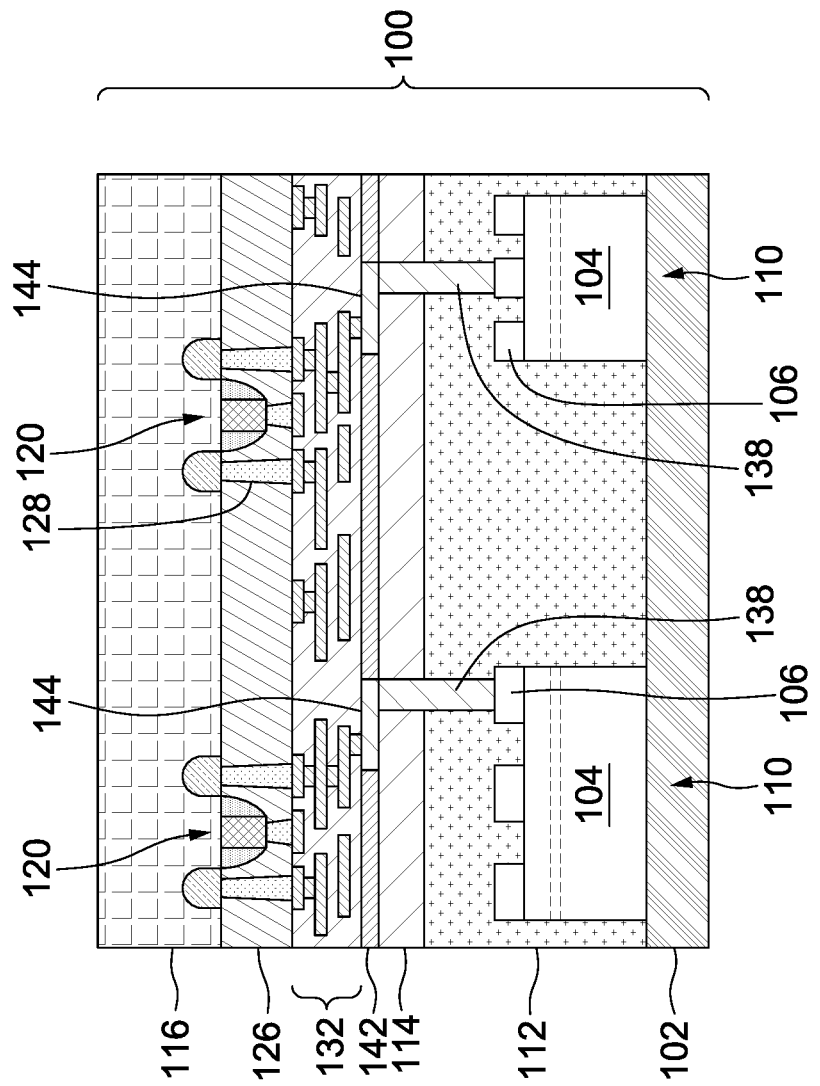
FIG. 20 is a cross-sectional view of a hybrid integrated circuit die, in accordance with some embodiments.

FIG. 20 is a cross-sectional view of a hybrid integrated circuit die 100, in accordance with some embodiments. The hybrid integrated circuit die 100 of this embodiment is the one resulting from the previously described process, where the first wafer 162 is bonded to the second wafer 164. Additionally, in this embodiment, each through via 138 is a single conductive via that extends through the isolation layer 114 and the dielectric layer 112.

Figure 21:
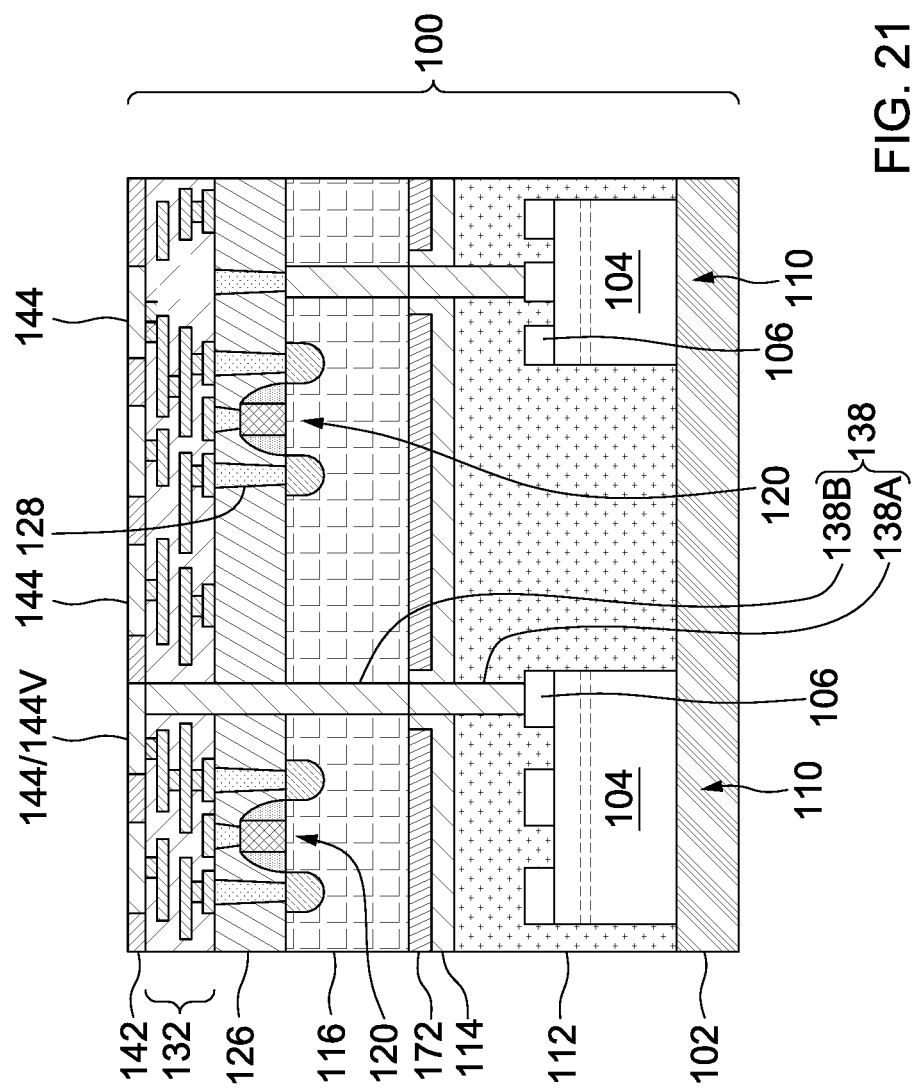
FIG. 21 is a cross-sectional view of a hybrid integrated circuit die, in accordance with some embodiments.

FIG. 21 is a cross-sectional view of a hybrid integrated circuit die 100, in accordance with some embodiments. This embodiment is similar to the embodiment described for FIG. 16A, except the hybrid integrated circuit die 100 further includes a metallization pattern 172. It should be appreciated that the metallization pattern 172 may be included in any of the previously described embodiments. Specifically, any of the embodiments described for FIGS. 11A-11C, 12A-12C, 15A-15C, 16A-16C, and 20 may include the metallization pattern 172 in the isolation layer 114.

The metallization pattern 172 includes metal lines formed in the isolation layer 114. The metallization pattern 172 may be formed of a suitable conductive material, such as copper, tungsten, aluminum, silver, gold, a combination thereof, or the like. The metallization pattern 172 may be formed by a damascene process, such as a single damascene process, a dual damascene process, or the like.

The isolation layer 114 and the metallization pattern 172 are both disposed between the first semiconductor devices 110 and the second semiconductor devices 120. The conductive material of the metallization pattern 172 provides additional noise reduction over that provided by the isolation layer 114, which may further increase the performance of the first semiconductor devices 110. The metallization pattern 172 is formed so that it occupies some of (e.g., from 10% to 30%) of the isolation layer 114, but is not formed in portions of the isolation layer 114 adjacent the through vias 138. The metal lines of the metallization pattern 172 are separated from the through vias 138 by those portions of the isolation layer 114. Shorting of the through vias 138 may thus be avoided.

Embodiments may achieve advantages. Forming both the first semiconductor devices 110 (e.g., Group III-V semiconductor devices) and the second semiconductor devices 120 (e.g., Group IV semiconductor devices) in a hybrid integrated circuit die 100 allows for die-level interconnection of the semiconductor devices, without utilizing packaging-level features to interconnect the semiconductor devices. Avoiding the use of packaging-level features for interconnection may increase signal integrity between the semiconductor devices, simplify device integration, simplify process complexity, and/or improve heat dissipation. Forming the isolation layer 114 (and, optionally, the metallization pattern 172) between the first semiconductor devices 110 and the second semiconductor devices 120 may help reduce interference between the first semiconductor devices 110 and the second semiconductor devices 120, particularly when the first semiconductor devices 110 are high-frequency semiconductor devices and the second semiconductor devices 120 are low-frequency semiconductor devices. Performance of the hybrid integrated circuit dies 100 may thus be improved.

In an embodiment, a device includes: a gallium nitride device on a substrate, the gallium nitride device including an electrode; a dielectric layer on and around the gallium nitride device; an isolation layer on the dielectric layer; a semiconductor layer on the isolation layer, the semiconductor layer including a silicon device; a through via extending through the semiconductor layer, the isolation layer, and the dielectric layer, the through via electrically and physically coupled to the electrode of the gallium nitride device; and an interconnect structure on the semiconductor layer, the interconnect structure including metallization patterns electrically coupled to the through via and the silicon device. In some embodiments of the device, the metallization patterns interconnect the gallium nitride device and the silicon device to form an integrated circuit. In some embodiments of the device, the through via extends through the interconnect structure, and the device further includes: die connectors electrically and physically coupled to the through via and to an upper metallization pattern of the metallization patterns. In some embodiments, the device further includes: an inter-layer dielectric between the semiconductor layer and the interconnect structure, the through via extending through the inter-layer dielectric, a lower metallization pattern of the metallization patterns electrically and physically coupled to the through via. In some embodiments, the device further includes: an inter-layer dielectric between the semiconductor layer and the interconnect structure; and a contact extending through the inter-layer dielectric, the contact electrically and physically coupled to the through via and to a lower metallization pattern of the metallization patterns. In some embodiments of the device, the through via is a single conductive via that extends through the semiconductor layer, the isolation layer, and the dielectric layer. In some embodiments of the device, the through via includes: a first conductive via extending through the isolation layer and the dielectric layer; and a second conductive via extending through the semiconductor layer. In some embodiments, the device further includes: metal lines in the isolation layer, the metal lines separated from the through via by portions of the isolation layer. In some embodiments of the device, a dielectric material of the isolation layer has a lower k-value than a dielectric material of the dielectric layer.

In an embodiment, a device includes: high-frequency semiconductor devices on a substrate; a dielectric layer on and between the high-frequency semiconductor devices; an isolation layer on the dielectric layer, a dielectric material of the isolation layer having a lower k-value than a dielectric material of the dielectric layer; a semiconductor layer on the isolation layer, the semiconductor layer including low-frequency semiconductor devices; and through vias extending through the semiconductor layer, the isolation layer, and the dielectric layer, the through vias electrically coupling the low-frequency semiconductor devices to the high-frequency semiconductor devices. In some embodiments of the device, the high-frequency semiconductor devices are Group III-V semiconductor devices. In some embodiments of the device, the low-frequency semiconductor devices are Group IV semiconductor devices.

In an embodiment, a method includes: forming a gallium nitride device over a substrate; depositing a dielectric layer over the gallium nitride device; disposing a semiconductor layer over the dielectric layer; forming a silicon device in the semiconductor layer; forming an interconnect structure, the interconnect structure interconnecting the silicon device and the gallium nitride device to form an integrated circuit; and singulating the interconnect structure, the semiconductor layer, and the dielectric layer to form a die including the integrated circuit. In some embodiments of the method, forming the gallium nitride device includes: growing gallium nitride layers over the substrate; patterning the gallium nitride layers; and forming a source electrode, a drain electrode, and a gate electrode on the gallium nitride layers. In some embodiments of the method, forming the silicon device includes: forming a gate structure on a channel region of the semiconductor layer; and forming a source/drain region adjacent the channel region. In some embodiments, the method further includes: depositing an isolation layer over the dielectric layer, the semiconductor layer deposited over the isolation layer, a dielectric material of the isolation layer having a lower k-value than a dielectric material of the dielectric layer. In some embodiments, the method further includes: forming metal lines in the isolation layer, the metal lines and the isolation layer disposed between the gallium nitride device and the silicon device. In some embodiments, the method further includes: before forming the silicon device, forming a through via through the semiconductor layer and the dielectric layer, the through via electrically coupled to the gallium nitride device. In some embodiments, the method further includes: after forming the silicon device and before forming the interconnect structure, forming a through via through the semiconductor layer and the dielectric layer, the through via electrically coupled to the gallium nitride device. In some embodiments, the method further includes: after forming the interconnect structure, forming a through via through the semiconductor layer and the dielectric layer, the through via electrically coupled to the gallium nitride device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gallium nitride device over a substrate;
   depositing a dielectric layer over and around the gallium nitride device;
   disposing a semiconductor layer over the dielectric layer;
   forming a silicon device in the semiconductor layer, the dielectric layer separating the silicon device from the gallium nitride device;
   forming an interconnect structure, the interconnect structure interconnecting the silicon device and the gallium nitride device to form an integrated circuit; and
   singulating the interconnect structure, the semiconductor layer, and the dielectric layer to form a die comprising the integrated circuit.

2. The method of claim 1, wherein forming the gallium nitride device comprises:
   growing gallium nitride layers over the substrate;
   patterning the gallium nitride layers; and
   forming a source electrode, a drain electrode, and a gate electrode on the gallium nitride layers.

3. The method of claim 1, wherein forming the silicon device comprises:
   forming a gate structure on a channel region of the semiconductor layer; and
   forming a source/drain region adjacent the channel region.

4. The method of claim 1 further comprising:
   depositing an isolation layer over the dielectric layer, the semiconductor layer deposited over the isolation layer, a dielectric material of the isolation layer having a lower k-value than a dielectric material of the dielectric layer.

5. The method of claim 4 further comprising:
   forming metal lines in the isolation layer, the metal lines and the isolation layer disposed between the gallium nitride device and the silicon device.

6. The method of claim 1 further comprising:
   before forming the silicon device, forming a through via through the semiconductor layer and the dielectric layer, the through via electrically coupled to the gallium nitride device.

7. The method of claim 1 further comprising:
   after forming the silicon device and before forming the interconnect structure, forming a through via through the semiconductor layer and the dielectric layer, the through via electrically coupled to the gallium nitride device.

8. The method of claim 1 further comprising:
   after forming the interconnect structure, forming a through via through the semiconductor layer and the dielectric layer, the through via electrically coupled to the gallium nitride device.

9. A method comprising:
   depositing a dielectric layer over and around a gallium nitride device;
   depositing an isolation layer over the dielectric layer, a dielectric material of the isolation layer being different than a dielectric material of the dielectric layer;
   disposing a semiconductor layer over the isolation layer;
   forming a silicon device in the semiconductor layer, the isolation layer separating the silicon device from the gallium nitride device;
   forming an interconnect structure, the interconnect structure interconnecting the silicon device and the gallium nitride device to form an integrated circuit; and singulating the interconnect structure, the semiconductor layer, the isolation layer, and the dielectric layer to form a die comprising the integrated circuit.

10. The method of claim 9 further comprising forming the gallium nitride device by:
   growing gallium nitride layers over a substrate;
   patterning the gallium nitride layers; and
   forming a source electrode, a drain electrode, and a gate electrode on the gallium nitride layers.

11. The method of claim 9, wherein forming the silicon device comprises:
   forming a gate structure over a channel region of the semiconductor layer; and
   forming a source/drain region adjacent the channel region.

12. The method of claim 9 further comprising:
   forming metal lines in the isolation layer.

13. The method of claim 9 further comprising:
   forming a through via through the semiconductor layer, the isolation layer, and the dielectric layer, the through via electrically coupled to the gallium nitride device.

14. A method comprising:
   depositing a dielectric layer over and around a gallium nitride device;
   depositing an isolation layer over the dielectric layer, a dielectric material of the isolation layer having a lower k-value than a dielectric material of the dielectric layer;
   disposing a semiconductor layer over the isolation layer;
   forming a silicon device in the semiconductor layer, the isolation layer separating the silicon device from the gallium nitride device;
   forming a through via through the semiconductor layer, the isolation layer, and the dielectric layer, the through via electrically coupled to the gallium nitride device;
   forming an interconnect structure, the interconnect structure comprising metallization patterns electrically coupled to the through via and the silicon device; and
   singulating the interconnect structure, the semiconductor layer, the isolation layer, and the dielectric layer.

15. The method of claim 14 further comprising forming the gallium nitride device by:
   growing gallium nitride layers over a substrate;
   patterning the gallium nitride layers; and
   forming a source electrode, a drain electrode, and a gate electrode on the gallium nitride layers.

16. The method of claim 14 further comprising:
   forming metal lines in the isolation layer, the metal lines separated from the through via by portions of the isolation layer.

17. The method of claim 14, wherein forming the through via comprises:
   forming an opening through the semiconductor layer, the isolation layer, and the dielectric layer, the opening exposing an electrode of the gallium nitride device; and
   forming a conductive material in the opening.

18. The method of claim 14, wherein forming the through via comprises:
   forming a first opening through the isolation layer and the dielectric layer, the first opening exposing an electrode of the gallium nitride device;
   forming a first conductive material in the first opening;
   forming a second opening through the semiconductor layer, the second opening exposing the first conductive material; and
   forming a second conductive material in the second opening.

19. The method of claim 14, wherein the gallium nitride device is a high-electron-mobility transistor.

20. The method of claim 19, wherein the silicon device is part of a controller for controlling the high-electron-mobility transistor.

* * * * *